(12) United States Patent
Tour et al.

(10) Patent No.: US 10,811,166 B2
(45) Date of Patent: Oct. 20, 2020

(54) PRODUCTION AND USE OF FLEXIBLE CONDUCTIVE FILMS AND INORGANIC LAYERS IN ELECTRONIC DEVICES

(71) Applicant: William Marsh Rice University, Houston, TX (US)

(72) Inventors: James M. Tour, Bellaire, TX (US); Yang Yang, Wanliuyuan community (CN); Gedeng Ruan, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 475 days.

(21) Appl. No.: 15/300,519

(22) PCT Filed: Apr. 8, 2015

(86) PCT No.: PCT/US2015/024945
§ 371 (c)(1),
(2) Date: Sep. 29, 2016

(87) PCT Pub. No.: WO2015/179035
PCT Pub. Date: Nov. 26, 2015

(65) Prior Publication Data
US 2017/0179518 A1    Jun. 22, 2017

Related U.S. Application Data

(60) Provisional application No. 61/976,715, filed on Apr. 8, 2014.

(51) Int. Cl.
*H01B 5/14* (2006.01)
*H01B 1/02* (2006.01)
(Continued)

(52) U.S. Cl.
CPC ............. *H01B 5/14* (2013.01); *C23C 14/205* (2013.01); *C23C 28/023* (2013.01); *C23C 30/00* (2013.01);
(Continued)

(58) Field of Classification Search
None
See application file for complete search history.

(56) References Cited

U.S. PATENT DOCUMENTS 4,279,709 A * 7/1981 McIntyre ................ C25B 11/00
204/291
4,851,308 A * 7/1989 Akhtar .................. G02F 1/1523
429/306
(Continued)

FOREIGN PATENT DOCUMENTS

CN    102176378 A    9/2011

OTHER PUBLICATIONS

English translation for CN102176378A (Ding et al). (Year: 2011).*
(Continued)

*Primary Examiner* — Sin J Lee
(74) *Attorney, Agent, or Firm* — Winstead PC

(57) ABSTRACT

Embodiments of the present disclosure pertain to methods of making conductive films by associating an inorganic composition with an insulating substrate, and forming a porous inorganic layer from the inorganic composition on the insulating substrate. The inorganic layer may include a nanoporous metal layer, such as nickel fluoride. The methods of the present disclosure may also include a step of incorporating the conductive films into an electronic device. The methods of the present disclosure may also include a step of associating the conductive films with a solid electrolyte prior to its incorporation into an electronic device. The methods of the present disclosure may also include a
(Continued)

step of separating the inorganic layer from the conductive film to form a freestanding inorganic layer. Further embodiments of the present disclosure pertain to the conductive films and freestanding inorganic layers.

39 Claims, 22 Drawing Sheets

(51) Int. Cl.

| | | |
|---|---|---|
| H01B 3/42 | (2006.01) | |
| C23C 28/02 | (2006.01) | |
| C23C 28/00 | (2006.01) | |
| C23C 30/00 | (2006.01) | |
| C23C 14/20 | (2006.01) | |
| C25D 7/00 | (2006.01) | |
| C25D 3/12 | (2006.01) | |
| C25D 5/48 | (2006.01) | |
| C25D 11/34 | (2006.01) | |
| C25D 11/04 | (2006.01) | |
| C25D 11/32 | (2006.01) | |
| C25D 11/30 | (2006.01) | |
| H01G 11/30 | (2013.01) | |
| H01G 11/26 | (2013.01) | |
| H01G 11/86 | (2013.01) | |
| H01G 9/00 | (2006.01) | |
| H01G 9/025 | (2006.01) | |
| H01G 9/042 | (2006.01) | |
| H01G 11/56 | (2013.01) | |
| H01M 4/58 | (2010.01) | |
| H01M 4/66 | (2006.01) | |
| H01M 10/0525 | (2010.01) | |
| H01M 10/056 | (2010.01) | |
| H01M 4/02 | (2006.01) | |

(52) U.S. Cl.
CPC ............ C25D 3/12 (2013.01); C25D 5/48 (2013.01); C25D 7/00 (2013.01); C25D 11/34 (2013.01); H01B 1/02 (2013.01); H01G 9/0036 (2013.01); H01G 9/025 (2013.01); H01G 9/042 (2013.01); H01G 11/26 (2013.01); H01G 11/30 (2013.01); H01G 11/86 (2013.01); H01M 4/582 (2013.01); H01M 4/663 (2013.01); H01M 10/056 (2013.01); H01M 10/0525 (2013.01); C25D 11/04 (2013.01); C25D 11/30 (2013.01); C25D 11/32 (2013.01); H01G 11/56 (2013.01); H01M 2004/021 (2013.01); H01M 2300/0091 (2013.01); Y02E 60/13 (2013.01)

(56) References Cited

U.S. PATENT DOCUMENTS

| | | | | |
|---|---|---|---|---|
| 5,641,591 | A * | 6/1997 | Kawakami | H01M 4/13 429/231.5 |
| 2003/0134122 | A1 | 7/2003 | Wickboldt et al. | |
| 2003/0227670 | A1 * | 12/2003 | Taki | C04B 35/553 359/355 |
| 2004/0152067 | A1 | 8/2004 | Wang et al. | |
| 2005/0118440 | A1 | 6/2005 | Mahon et al. | |
| 2007/0087183 | A1 * | 4/2007 | Li | B23B 17/10018 428/304.4 |
| 2008/0007893 | A1 | 1/2008 | Takagi et al. | |
| 2008/0044910 | A1 * | 2/2008 | Hairault | C09K 11/06 436/56 |
| 2010/0003511 | A1 | 1/2010 | So | |
| 2010/0271755 | A1 | 10/2010 | Kaminska et al. | |
| 2011/0041914 | A1 * | 2/2011 | Hasegawa | H01G 9/2077 136/256 |
| 2011/0260741 | A1 | 10/2011 | Weaver et al. | |
| 2011/0262816 | A1 | 10/2011 | Amatucci | |
| 2011/0286071 | A1 * | 11/2011 | Huang | G02F 1/163 359/265 |
| 2012/0026644 | A1 * | 2/2012 | Dunn | H01G 11/46 361/502 |
| 2013/0078449 | A1 * | 3/2013 | Naito | H01B 1/02 428/324 |
| 2013/0105069 | A1 | 5/2013 | Van Nutt et al. | |
| 2016/0379764 | A1 | 12/2016 | Tour et al. | |

OTHER PUBLICATIONS https://www.nanorh.com/product/platinurn-coated-silicon-wafer-p-si-wafer-coated-with-platinum/ (a webpage obtained from the internet). (date unknown).*
European Patent Office, Extended Search Report, Appl. No. EP15795979.2, dated Oct. 26, 2017.
Xie, J., et al, "Layer-by-layer [beta]-Ni(OH)2/graphene nanohybrids for ultraflexible all-solid-state thin-film supercapacitors with high electrochemical performance", Nano Energy (2013) 2, 65-74.
International Search Report and Written Opinion for PCT/US15/24945, dated Jan. 7, 2016.
International Preliminary Report on Patentability for PCT/US15/24945, dated Oct. 20, 2016.
Nyholm et al., Toward Flexible Polymer and Paper-Based Energy Storage Devices, Adv. Mater. 2011, 23, 3751.
Jiang et al., Recent Advances in Metal Oxide-based Electrode Architecture Design for Electrochemical Energy Storage, Adv. Mater. 2012, 24, 5166.
Pech et al., Ultrahigh-power micrometre-sized supercapacitors based on onion-like carbon, Nature Nanotech. 2010, 5, 651.
El-Kady et al., Laser scribing of high-performance and flexible graphene-based electrochemical capacitors, Science 2012, 335, 1326.
Yoshino, A. , The Birth of the Lithium-Ion Battery, Angew. Chem. Int. Ed. 2012, 51, 5798.
Horng et al., Flexible supercapacitor based on polyaniline nanowires/carbon cloth with both high gravimetric and area-normalized capacitance, J. Power Sour. 2010, 195, 4418.
Kaempgen et al. Printable Thin Film Supercapacitors Using Single-Walled Carbon Nanotubes, Nano Lett. 2009, 9, 1872.
Meng et al., Highly Flexible and All-Solid-State Paperlike Polymer Supercapacitors, Nano Lett. 2010, 10, 4025.
Lu et al., WO3-x@Au@MnO2 Core-Shell Nanowires on Carbon Fabric for High-Performance Flexible Supercapacitors, Adv. Mater. 2012, 24, 938.
Wang et al., A review of electrode materials for electrochemical supercapacitors , J. Chem. Soc. Rev. 2012, 41, 797.
Choi et al., Fast and Reversible Surface Redox Reaction in Nanocrystalline Vanadium Nitride Supercapacitors, Adv. Mater. 2006, 18, 1178.
Zhang et al., Nanostructured nickel fluoride thin film as a new Li storage material, Solid State Sci. 2008, 10, 1166.
Lang et al., Nanoporous metal/oxide hybrid electrodes for electrochemical supercapacitors, Nature Nanotech. 2011, 6, 232.
Huang et al., Theoretical Model for Nanoporous Carbon Supercapacitors, Angew. Chem. Int. Ed. 2008, 47, 520.
Wang et al., Ni(OH)2 Nanoplates Grown on Graphene as Advanced Electrochemical Pseudocapacitor Materials, J. Am. Chem. Soc. 2010, 132, 7472.
Office Action for Chinese Patent Application No. 201580030372.1, dated May 31, 2018.

* cited by examiner

PRODUCTION AND USE OF FLEXIBLE CONDUCTIVE FILMS AND INORGANIC LAYERS IN ELECTRONIC DEVICES

CROSS-REFERENCE TO RELATED APPLICATIONS

This application claims priority to U.S. Provisional Patent Application No. 61/976,715, filed on Apr. 8, 2014. The entirety of the aforementioned application is incorporated herein by reference.

STATEMENT REGARDING FEDERALLY SPONSORED RESEARCH

The invention was made with government support under Grant No. N00014-09-1-1066, awarded by the U.S. Department of Defense; Grant No. FA9550-12-1-0035, awarded by the U.S. Department of Defense; and Grant No. FA9550-09-1-0581, awarded by the U.S. Department of Defense. The government has certain rights in the invention.

BACKGROUND

Current methods of making electronic device components have limitations in terms of cost effectiveness, scalability, and efficiency. Furthermore, current electronic device components have limited electrical properties. Various aspects of the present disclosure address the aforementioned limitations.

SUMMARY

In some embodiments, the present disclosure pertains to methods of making a conductive film by associating an inorganic composition with an insulating substrate. In some embodiments, the association results in the formation of an inorganic layer from the inorganic composition on the insulating substrate. In some embodiments, the insulating substrate is an insulating polymer, such as poly(ethylene terephthalate). In some embodiments, the insulating substrate is also associated with one or more adhesion layers (e.g., chromium thin films). In some embodiments, the insulating substrate is also associated with one or more conductive layers (e.g., gold thin films). In some embodiments, the one or more adhesion layers are below the one or more conductive layers.

In some embodiments, the inorganic composition includes a metal, such as nickel. In some embodiments, the inorganic composition is associated with the insulating substrate by electrochemical deposition. In some embodiments, the formation of the inorganic layer on the insulating substrate includes an anodic treatment of the inorganic composition. In some embodiments, the formation of the inorganic layer on the insulating substrate includes a cathodic treatment of the inorganic composition.

In some embodiments, the inorganic layer includes the following formula: $MX_n$; where M includes, without limitation, metals, transition metals, alloys thereof, and combinations thereof; where X includes, without limitation, halides, oxides, chalcogenides, and combinations thereof; and where n is an integer ranging from 1 to 6. In some embodiments, the inorganic layer includes nickel fluoride ($NiF_2$).

In some embodiments, the inorganic layer is porous. In some embodiments, the inorganic layer includes pores with diameters ranging from about 1 nm to about 50 nm. In some embodiments, the inorganic layer has a thickness ranging from about 500 nm to about 1 μm. In some embodiments, the inorganic layer has a capacitance ranging from about 0.1 $mF/cm^2$ to about 1,000 $mF/cm^2$, an energy density ranging from about 0.1 Wh/kg to about 500 Wh/kg, and a power density ranging from about 1 kW/kg to about 50 kW/kg.

In some embodiments, the methods of the present disclosure also include a step of incorporating the formed conductive films into an electronic device. In some embodiments, the methods of the present disclosure also include a step of associating the conductive film with a solid electrolyte prior to incorporating the conductive film into an electronic device.

In some embodiments, the electronic device includes, without limitation, energy storage devices, electrodes, electrode systems, batteries, lithium-ion batteries, supercapacitors, electrochemical capacitors, microsupercapacitors, pseudocapacitors, electric double-layer capacitors, fuel cells, micro-circuits, semi-conductors, transistors, portable electronic devices, flexible electronic devices, and combinations thereof. In some embodiments, the electronic devices of the present disclosure have an energy density ranging from about 10 Wh/kg to about 500 Wh/kg, a capacitance ranging from about 1 $mF/cm^2$ to about 1,000 $mF/cm^2$, and a power density ranging from about 1 kW/kg to about 200 kW/kg.

In some embodiments, the methods of the present disclosure also include a step of separating an inorganic layer from a conductive film to form a freestanding inorganic layer. In some embodiments, the separated inorganic layer may be associated with a solid electrolyte and then incorporated into an electronic device.

In some embodiments, the present disclosure pertains to conductive films that are formed by the methods of the present disclosure. In some embodiments, the conductive film includes an insulating substrate and an inorganic layer associated with the insulating substrate. In some embodiments, the inorganic layer is porous. In some embodiments, the insulating substrate is also associated with one or more adhesion layers. In some embodiments, the insulating substrate is also associated with one or more conductive layers. In some embodiments, the conductive film has a thickness ranging from about 1 μm to about 1 m. In some embodiments, the conductive film has a thickness ranging from about 100 μm to about 200 μm.

Additional embodiments of the present disclosure pertain to the freestanding inorganic layers that are formed by the methods of the present disclosure. Further embodiments of the present disclosure pertain to electronic devices that contain the conductive films and inorganic layers of the present disclosure.

DESCRIPTION OF THE FIGURES

FIG. 1 provides schemes and illustrations relating to conductive films and inorganic layers.

FIG. 2A is a schematic of the flexible NPL on a poly(ethylene terephthalate) (PET) substrate that is covered with a gold (Au) conductive layer and a chromium (Cr) adhesion layer (Au (~40 nm)/Cr (~10 nm)/PET substrate (~35 µm)). The image on the right panel represents half of the image on the left panel. Atop the solid electrolyte layer is another nanoporous layer, then Au/Cr and finally PET to complete the sandwich structure. More specifically, there is one solid electrolyte layer separating two halves of a nanoporous layer, Au/Cr, and PET. The entire sandwich shown on the left panel is ~170 µm thick. FIG. 2B shows a photograph of a flexible electrode under bending. FIG. 2C is an image of a free-standing NPL after removing the substrate. FIGS. 2D-F are scanning electron microscopy (SEM) images of the free-standing NPL taken from different viewing directions, including cross section (FIG. 2D), top (FIG. 2E) and bottom (FIG. 2E), respectively. FIG. 2G is a high resolution transmission electron microscopy (HRTEM) image of the NPL.

FIGS. 6A-D show scan rates of 50 mV s$^{-1}$, 1 V s$^{-1}$, 10 V s$^{-1}$, and 100 V s$^{-1}$, respectively.

FIGS. 7A-B shows CVs recorded at different scan rates from 50 mV s$^{-1}$ to 100 V s$^{-1}$ within a potential window from −0.8 to 0.8 V. FIGS. 7C-D show cyclic voltogramms (CVs) recorded at different scan rates from 50 mV s$^{-1}$ to 100 V s$^{-1}$ within a potential window from −1.4 to 1.4 V. FIGS. 7E-F show Galvanostatic discharge/charge (GDC) curves operated at 0.2 mA cm$^{-2}$ and 1 mA cm$^{-2}$, respectively. FIG. 7G shows electrochemical impedance spectroscopy (EIS) measured within a frequency range of 10$^{-2}$ to 10$^{4}$ Hz.

FIGS. 8A-B show CVs recorded at different scan rates from 50 mV s$^{-1}$ to 100 V s$^{-1}$ within a potential window from −0.8 to 0.8 V. FIGS. 8C-D show CVs recorded at different scan rates from 50 mV s$^{-1}$ to 100 V s$^{-1}$ within a potential window from −1.4 to 1.4 V. FIGS. 8E-F show GDC curves operated at 0.2 mA cm$^{-2}$ and 1 mA cm$^{-2}$, respectively. FIG. 8G shows EIS measured within a frequency range of 10$^{-2}$ to 10$^{4}$ Hz.

FIGS. 9A-B show CVs recorded at different scan rates from 50 mV s$^{-1}$ to 100 V s$^{-1}$ within a potential window from −0.8 to 0.8 V. FIGS. 9C-D show CVs recorded at different scan rates from 50 mV s$^{-1}$ to 100 V s$^{-1}$ within a potential window from −1.4 to 1.4 V. FIGS. 9E-F show GDC curves operated at 0.2 mA cm$^{-2}$ and 1 mA cm$^{-2}$, respectively. FIG. 9G shows EIS measured within a frequency range of 10$^{-2}$ to 10$^{4}$ Hz.

FIGS. 10A-B show CVs recorded at different scan rates from 50 mV s$^{-1}$ to 100 V s$^{-1}$ within a potential window from −0.8 to 0.8 V. FIGS. 10C-D show CVs recorded at different scan rates from 50 mV s$^{-1}$ to 100 V s$^{-1}$ within a potential window from −1.4 to 1.4 V. FIGS. 10E-F show GDC curves operated at 0.2 mA cm$^{-2}$ and 1 mA cm$^{2}$, respectively. FIG. 10G shows EIS measured within a frequency range of 10$^{-2}$ to 10$^{4}$ Hz.

FIGS. 11A-B show CVs recorded at different scan rates from 50 mV s$^{-1}$ to 100 V s$^{-1}$ within a potential window from −0.8 to 0.8 V. FIGS. 11C-D show CVs recorded at different scan rates from 50 mV s$^{-1}$ to 100 V s$_{1}$ within a potential window from −1.4 to 1.4 V. FIGS. 11E-F show GDC curves operated at 0.2 mA cm$^{-2}$ and 1 mA cm$^{-2}$, respectively. FIG. 11G shows EIS measured within a frequency range of 10$^{-2}$ to 10$^{4}$ Hz.

FIG. 12A provides CVs of the NPL at different scan rates from 10 to 100 V s$^{-1}$. FIG. 12B provides a log (anodic peak current) vs. log (scan rate) plot. FIG. 12C provides Galvanostatic discharge/charge (GDC) curves of the NPL at a current density of 0.1 mA cm$^{-2}$. FIG. 12D provides CVs of the NPL at 10 (black line) and 20 (red line) mV s$^{-1}$. FIG. 12E provides a log (anodic peak current) vs. log (scan rate) plot. FIG. 12F provides GDC curves of the NPL at a current density of 1 mA cm$^{-2}$.

FIG. 13A provides CVs recorded at different scan rates from 50 mV s$^{-1}$ to 5 V s$^{-1}$. FIG. 13B shows GDC curves recorded at 0.2 mA cm$^{-2}$, 0.5 and 1 mA cm$^{-2}$. FIG. 13C shows $C_A/C_V$ vs. scan rates measured from CVs.

FIGS. 14A-D provide CVs recorded from 1$^{st}$ to 100$^{th}$, 101$^{th}$ to 200$^{th}$, 201$^{th}$ to 300$^{th}$ and 301$^{th}$ to 400$^{th}$ cycles, respectively. The inset in (FIG. 14A) is the initial three CV cycles.

FIGS. 15A-B show CVs recorded at different scan rates from 50 mV s$^{-1}$ to 10 V s$^{-1}$. FIG. 15C shows GDC curves recorded at 2 mA cm$^{-2}$, 5 mA cm$^{-2}$, and 10 mA cm$^{-2}$. FIG. 15D shows $C_A/C_V$ vs. scan rates measured from CVs.

FIG. 16A provides a Nyquist plot of the device tested at the open circuit potential within frequency range from 10$^{2}$ to 10$^{4}$ Hz. The inset shows the enlarged plot in the high frequency region. FIG. 16B provides a Bode plot. FIG. 16C provides a Real (C') and imaginary (C") portion of complex capacitance. FIG. 16D provides a Ragone plot. FIGS. 16E-F provides GDC curves of a single device and two devices connected in series and in parallel, tested in NPW and WPW, respectively. FIG. 16G provides a 10,000 cycle GDC testing within both a NPW (black) and WPW (red).

FIGS. 17A-B show SEM cross sectional images with different magnifications. FIGS. 17C-D show TEM images.

FIG. 19A shows a photograph of the flexible EC device while bent. FIG. 19B shows a schematic representation of the definition of bending angle. FIG. 19C shows the dependence of capacitance retention on bending angle. FIG. 19D shows the dependence of capacitance retention on bending cycles to 180° bending angle. The inset shows GDC curves recorded before and after bending for 500 and 1000 cycles.

FIGS. 21A-B show SEM images of the nanoporous layer grown on Fe/PET. FIGS. 21C-D show SEM images of the nanoporous layer grown on Co/PET.

DETAILED DESCRIPTION

Figure 1A:
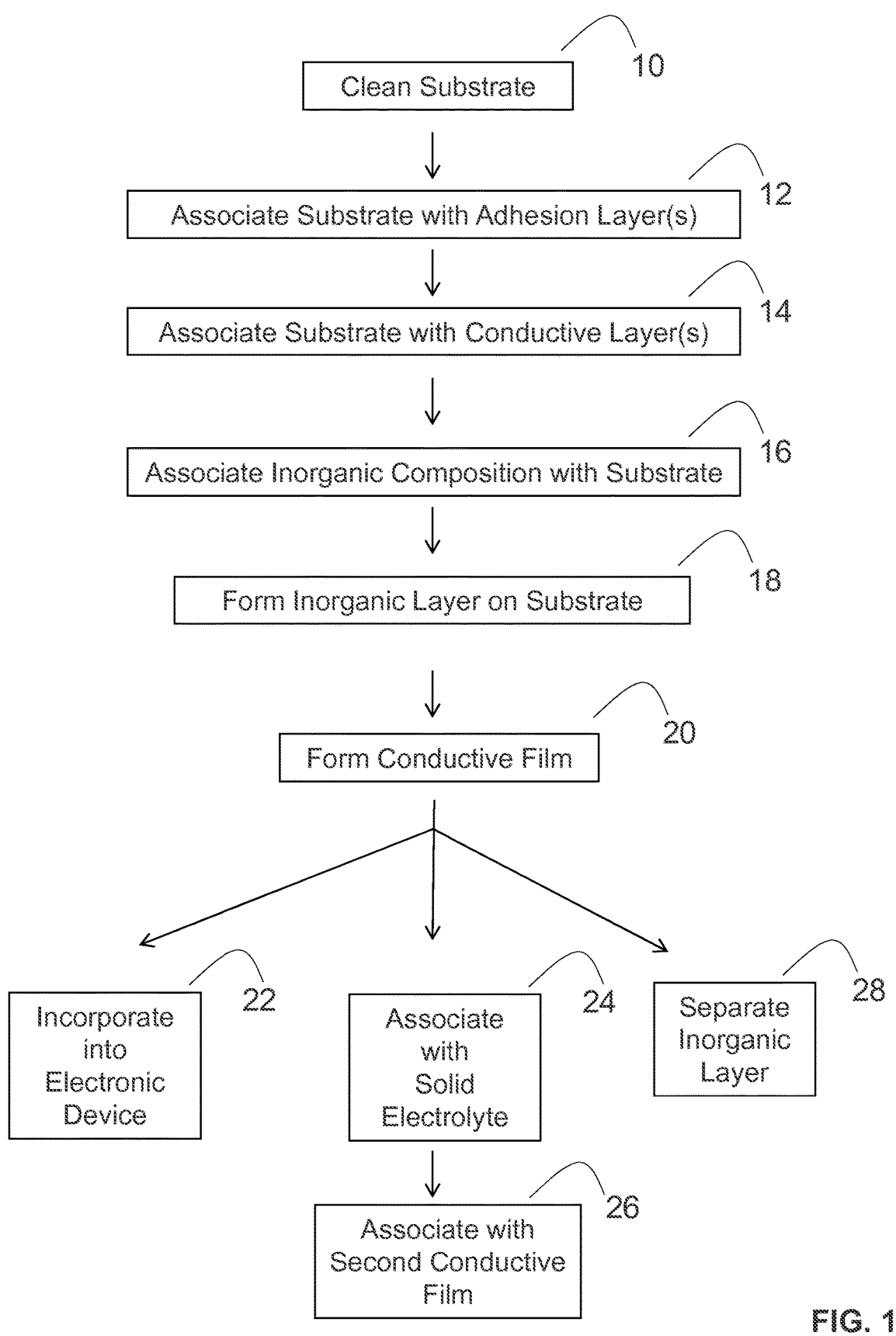
FIG. 1A provides schemes of methods of making conductive films and inorganic layers, and methods of incorporating the products into electronic devices.

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that include more than one unit unless specifically stated otherwise.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Advances in soft portable electronic devices (PEDs), such as roll-up touch screen displays, artificial electronic skin, e-paper and wearable systems for both personal and military uses, require the development of flexible energy devices. Flexible supercapacitors or electrochemical capacitors (ECs) can be based on non-faradaic electrostatic adsorption such as in electric double-layer capacitors (EDLCs) on carbon materials. The behavior of such energy devices can also be based upon faradaic redox reactions, such as in pseudocapacitors made from transition metal oxides. These flexible EC devices have displayed an increasing role in portable energy storage devices due to their fast dynamic responses, long-term cyclability and integrated advantages over conventional capacitors (for high power) and batteries (for high energy).

From a practical viewpoint, for use in PEDs, it is desirable to achieve high capacitance within a limited area or volume, since PEDs are small in size. Hence, areal capacitance ($C_A$) and volumetric capacitance ($C_V$), rather than the conventionally used gravimetric capacitance, are better indications of the performance. Conducting polymers such as polyaniline and various carbon-based materials, including carbon nanotubes (CNTs), reduced graphene oxide (rGO) and carbon fibers, deliver low $C_A$ and $C_V$ due to their low densities (less than 2 g cm$^{-3}$), although they have high flexibility.

The poor mechanical flexibility of inorganic metal compounds with high $C_A$ and $C_V$, having the general formula MX (X=O, N or F), have been improved by forming hybrid composites using conducting polymers or carbon-based materials as the matrix, or by manufacturing the materials into nanostructures. For instance, three-dimensional (3-D) nanoporous structures hold promise due to their good flexibility and high surface area. The nanopores lead to the enhancement of the performance of the ECs by facilitating ion transport and creating more active reaction sites. However, current methods of making the aforementioned 3-D structures have limitations in terms of cost effectiveness, scalability, and efficiency. Furthermore, the aforementioned 3-D structures may have limited electrical properties. Various aspects of the present disclosure address the aforementioned limitations.

In some embodiments, the present disclosure pertains to methods of making a conductive film that contains an inorganic layer. In some embodiments, the present disclosure pertains to the conductive films and the inorganic layers that are made by the methods of the present disclosure. In some embodiments, the conductive film or the inorganic layers alone can be utilized as a component of an electronic device. In some embodiments, the present disclosure pertains to electronic devices that contain the conductive films or the inorganic layers of the present disclosure.

Various methods may be utilized to make the conductive films and inorganic layers of the present disclosure. In some embodiments illustrated in FIG. 1A, the methods of the present disclosure can include one or more of the following steps: cleaning an insulating substrate (step 10); associating the insulating substrate with one or more adhesion layers (step 12); associating the insulating substrate with one or more conductive layers (step 14); associating an inorganic composition with the insulating substrate (step 16); and forming an inorganic layer from the inorganic composition on the insulating substrate (step 18), thereby forming the conductive film (step 20).

The formed conductive films can have various structures. For instance, in some embodiments illustrated in FIG. 1B, a formed conductive film 50 can have an insulating substrate 58, an adhesion layer 56 positioned on a surface of the insulating substrate, a conductive layer 54 positioned on a surface of the adhesion layer, and an inorganic layer 52 positioned on a surface of the conductive layer.

Moreover, the formed conductive films of the present disclosure can be utilized and processed in various manners. For instance, in some embodiments that are further illustrated in FIG. 1A, the formed conductive films of the present disclosure can be incorporated into an electronic device (step 22). In some embodiments, the formed conductive films may be associated with a solid electrolyte (step 24) and then associated with a second conductive film (step 26) to form an electronic device component, such as electronic device component 60 illustrated in FIG. 1C, where a first conductive film 62 and a second conductive film 66 are positioned between solid electrolyte 64. In some embodiments, the formed electronic device component may then be incorporated into an electronic device.

Figure 1B:
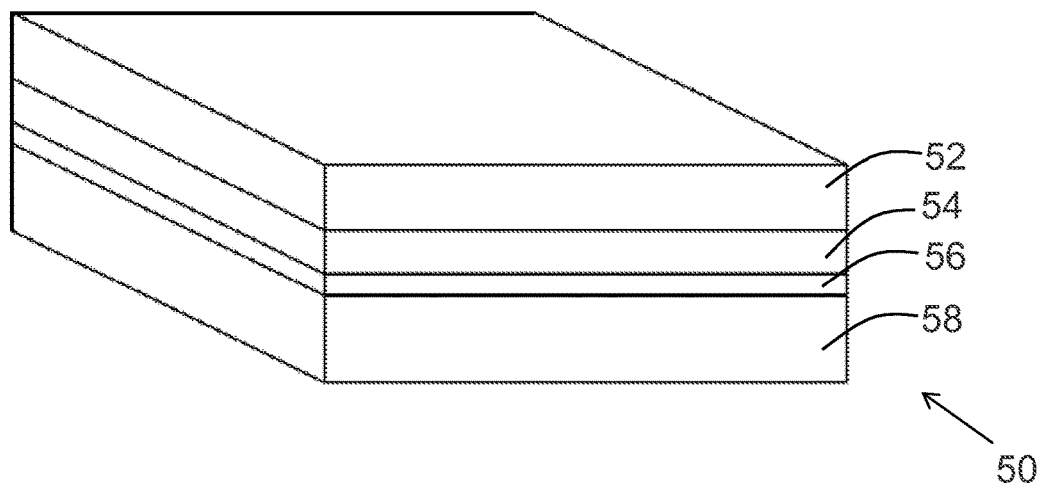
FIG. 1B provides an illustration of a conductive film.

In some embodiments, an inorganic layer of a conductive film (e.g., inorganic layer 52 of conductive film 50, as shown in FIG. 1B) may be separated from the conductive film to form a free-standing inorganic layer (step 28 in FIG. 1A). In some embodiments, the freestanding inorganic layer may be associated with a solid electrolyte and then incorporated into an electronic device.

As set forth in more detail herein, the present disclosure can have numerous embodiments. For instance, various methods may be utilized to associate various types of insulating substrates with various types of inorganic compositions to form various types of inorganic layers on the insulating substrates. Various types of conductive films may also be prepared by the methods of the present disclosure. Moreover, the formed conductive films and inorganic layers of the present disclosure can be incorporated into various types of electronic devices.

Insulating Substrates

The present disclosure can utilize various types of insulating substrates. In addition, the insulating substrates of the present disclosure can have various compositions. For instance, in some embodiments, the insulating substrates of the present disclosure include, without limitation, insulating polymers, plastics, glasses, silicon-based substrates (e.g., $Si/SiO_2$ wafers), metals, transition metals, carbon nanotubes, graphenes, carbons, and combinations thereof.

In some embodiments, the insulating substrates of the present disclosure include insulating polymers. In some embodiments, the insulating polymers include, without limitation, poly(ethylene)s, poly(propylene)s, polyalkyl siloxanes, and combinations thereof. In some embodiments, the insulating polymers of the present disclosure include poly(ethylene terephthalate).

In some embodiments, the insulating substrates of the present disclosure include graphenes. In some embodiments, the graphenes include, without limitation, graphene oxides, reduced graphene oxides, chemically converted graphene, functionalized graphene, and combinations thereof.

In some embodiments, the insulating substrates of the present disclosure may be associated with one or more adhesion layers (e.g., adhesion layer 56 in FIG. 1B). In some embodiments, the one or more adhesion layers include, without limitation, chromium, titanium, nickel, and combinations thereof. In some embodiments, the one or more adhesion layers include chromium, such as a chromium thin film.

In some embodiments, the insulating substrates of the present disclosure may be associated with one or more conductive layers (e.g., conductive layer 54 in FIG. 1B). In some embodiments, the one or more conductive layers include, without limitation, gold, aluminum, copper, platinum, silver, and combinations thereof. In some embodiments, the one or more conductive layers include gold, such as a gold thin film. In some embodiments, the one or more conductive layers may be directly associated with an inorganic layer (e.g., conductive layer 54 and inorganic layer 52 in FIG. 1B). In some embodiments, the one or more conductive layers may be positioned between an inorganic layer and an adhesion layer on an insulating substrate (e.g., adhesion layer 56, conductive layer 54 and inorganic layer 52 on insulating substrate 58 in FIG. 1B). In some embodiments, an inorganic layer may be positioned on a surface of the one or more conductive layers.

In some embodiments, the insulating substrates of the present disclosure may be associated with one or more conductive layers and one or more adhesion layers. In some embodiments, the one or more adhesion layers are below the one or more conductive layers (e.g., as illustrated in FIG. 1B).

The insulating substrates of the present disclosure can have various shapes and sizes. For instance, in some embodiments, the insulating substrates of the present disclosure can have circular, coiled, rolled, oval, square, hexagonal, rectangular, conformal or irregular shapes. In some embodiments, the insulating substrates of the present disclosure can have surface areas that range from about 1 $mm^2$ to about 10 $m^2$. Additional shapes and sizes can also be envisioned.

In some embodiments, the insulating substrates of the present disclosure can include flexible insulating substrates. In some embodiments, the insulating substrates of the present disclosure can include hard insulating substrates. In some embodiments, the insulating substrates of the present disclosure are hard insulating substrates that are in the form of a block. Additional forms of insulating substrates can also be envisioned.

Association of Insulating Substrates with Inorganic Compositions

Various methods may be utilized to associate insulating substrates with inorganic compositions. For instance, in some embodiments, the association occurs by a method that includes, without limitation, sputtering, spraying, electrodeposition, printing, electron beam evaporation, thermal evaporation, atomic layer deposition, and combinations thereof. In some embodiments, the association of insulating substrates with inorganic compositions occurs by electrochemical deposition. Additional association methods can also be envisioned.

The insulating substrates of the present disclosure may be pre-treated in various manners prior to their association with inorganic compositions. For instance, in some embodiments, the methods of the present disclosure may also include a step of cleaning an insulating substrate prior to associating the inorganic compositions with the insulating substrate. In some embodiments, the cleaning occurs by exposing the insulating substrate to a cleaning agent. In some embodiments, the cleaning agent can include, without limitation, alcohol (e.g., 2-propanol), water (e.g., deionized water), or a stream of gas (e.g., an argon/oxygen gas). Additional methods by which to clean an insulating substrate can also be envisioned.

In some embodiments, the methods of the present disclosure may also include a step of associating an insulating substrate with one or more adhesion layers or conductive layers prior to associating inorganic compositions with the insulating substrate. Additional insulating substrate pre-treatment methods can also be envisioned.

Inorganic Compositions

Various types of inorganic compositions may be applied to the insulating substrates of the present disclosure. For instance, in some embodiments, the inorganic compositions include, without limitation, metals, transition metals, metal oxides, transition metal oxides, metal chalcogenides, metal halides, alloys thereof, and combinations thereof.

In some embodiments, the inorganic compositions of the present disclosure include a metal. In some embodiments, the metal includes, without limitation, iron, nickel, cobalt, platinum, gold, aluminum, chromium, copper, manganese, magnesium, molybdenum, rhodium, silicon, tantalum, titanium, tungsten, uranium, vanadium, zirconium, alloys thereof, and combinations thereof. In some embodiments, the inorganic composition includes nickel, such as $NiSO_4$. Additional inorganic compositions can also be envisioned.

The inorganic compositions of the present disclosure may be associated with insulating substrates in various states. For instance, in some embodiments, the inorganic compositions can be in a liquid state, a gaseous state, a solid state, or combinations of such states. In some embodiments, the inorganic compositions of the present disclosure may be in a liquid state when they are associated with insulating substrates.

Formation of Inorganic Layers from Inorganic Compositions

Inorganic layers can form from inorganic compositions in various manners. For instance, in some embodiments, the formation of an inorganic layer occurs by the solidification of the inorganic composition on the insulating substrate. In some embodiments, inorganic layers form spontaneously upon the association of the inorganic composition with the insulating substrate. In some embodiments, the formation of an inorganic layer includes various chemical reactions. For instance, in some embodiments, the formation of an inorganic layer includes an oxidation reaction, a reduction reaction, and combinations of such reactions.

In some embodiments, the formation of inorganic layers from inorganic compositions may include an additional step. For instance, in some embodiments, the formation of the inorganic layer includes an anodic treatment of the inorganic composition. In some embodiments, the formation of the inorganic layer includes a cathodic treatment of the inorganic composition. In some embodiments, the anodic or cathodic treatments may include the application of a current onto the inorganic composition. In some embodiments, the applied current can be varied to tailor the pore size or thickness of the inorganic layer. For instance, in some embodiments, an applied current density can be varied from about 1 mA cm$^{-2}$ to about 100 mA cm$^{-2}$ to control the pore size and thickness of the inorganic layers.

Inorganic Layers

The methods of the present disclosure can be utilized to form various types of inorganic layers on insulating substrates. Additional embodiments of the present disclosure pertain to the formed inorganic layers (e.g., inorganic layer 52 in FIG. 1B).

The inorganic layers of the present disclosure can include various compositions. For instance, in some embodiments, the inorganic layers of the present disclosure include the following formula:

$MX_n$

In some embodiments, M includes, without limitation, metals, transition metals, alloys thereof, and combinations thereof. In some embodiments, X includes, without limitation, halides, oxides, chalcogenides, and combinations thereof. In some embodiments, n is an integer that ranges from 1 to 6.

In some embodiments, M is a metal that includes, without limitation, iron, nickel, cobalt, platinum, gold, aluminum, chromium, copper, manganese, magnesium, molybdenum, rhodium, silicon, tantalum, titanium, tungsten, uranium, vanadium, zirconium, alloys thereof, and combinations thereof. In some embodiments, X is a halide that includes, without limitation, fluorine, chlorine, bromine, and combinations thereof. In some embodiments, n is an integer that ranges from 1 to 6.

In some embodiments, the inorganic layers of the present disclosure include nickel fluoride ($NiF_2$). Additional inorganic layer compositions can also be envisioned.

The inorganic layers of the present disclosure can include a single layer or multiple layers. For instance, in some embodiments, the inorganic layers of the present disclosure include from about one layer to about ten layers. In some embodiments, the inorganic layers of the present disclosure include a single layer.

The inorganic layers of the present disclosure can include various thicknesses. For instance, in some embodiments, the inorganic layers of the present disclosure have a thickness ranging from about 1 nm to about 1 m. In some embodiments, the inorganic layers of the present disclosure have a thickness ranging from about 500 nm to about 1 µm. In some embodiments, the inorganic layers of the present disclosure have a thickness ranging from about 800 nm to about 1 µm. In some embodiments, the inorganic layers of the present disclosure have a thickness of about 900 nm.

The inorganic layers of the present disclosure can also have various porosities. For instance, in some embodiments, the inorganic layers of the present disclosure may be non-porous. In some embodiments, the inorganic layers of the present disclosure are porous. In some embodiments, the inorganic layers of the present disclosure include pores with diameters between about 1 nanometer to about 5 micrometers. In some embodiments, the pores include macropores with diameters of at least about 50 nm. In some embodiments, the pores include macropores with diameters between about 50 nanometers to about 3 micrometers. In some embodiments, the pores include macropores with diameters between about 500 nanometers to about 2 micrometers. In some embodiments, the pores include mesopores with diameters of less than about 50 nm. In some embodiments, the pores include micropores with diameters of less than about 2 nm.

In some embodiments, the pores of the inorganic layers of the present disclosure include diameters that range from about 5 nm to about 100 nm. In some embodiments, the inorganic layers of the present disclosure include pores with diameters that range from about 1 nm to about 50 nm. In some embodiments, the inorganic layers of the present disclosure include pores with diameters that range from about 2 nm to about 20 nm. In some embodiments, the inorganic layers of the present disclosure include pores with diameters that range from about 2 nm to about 10 nm. In some embodiments, the inorganic layers of the present disclosure include pores with diameters of about 5 nm.

In some embodiments, the methods of the present disclosure can also include a step of controlling the pore size or thickness of the inorganic layers. For instance, in some embodiments, the step of associating inorganic compositions with an insulating substrate can be tailored in order to control the pore size or thickness of the inorganic layer. In some embodiments, an electrochemical deposition solution can be varied to control the pore size or thickness of the inorganic layer.

In some embodiments, the duration of the step of associating an inorganic composition with an insulating substrate can be varied to control the pore size or thickness of the inorganic layer. For instance, in some embodiments, the duration of the step of associating an inorganic composition with an insulating substrate (e.g., an electrochemical deposition step) can be varied from about 1 second to about 100 hours to control the thickness of the inorganic layer.

The inorganic layers of the present disclosure can have various advantageous electrical properties. For instance, in some embodiments, the inorganic layers of the present disclosure have a capacitance ranging from about 0.1 mF/cm$^2$ to about 1,000 mF/cm$^2$. In some embodiments, the inorganic layers of the present disclosure have a capacitance ranging from about 0.1 mF/cm$^2$ to about 10 mF/cm$^2$. In some embodiments, the inorganic layers of the present disclosure have a capacitance ranging from about 0.1 mF/cm$^2$ to about 1 mF/cm$^2$. In some embodiments, the inorganic layers of the present disclosure have a capacitance ranging from about 0.1 mF/cm$^2$ to about 0.5 mF/cm$^2$. In some embodiments, the inorganic layers of the present disclosure have a capacitance of about 0.29 mF/cm$^2$.

In some embodiments, the inorganic layers of the present disclosure have an energy density ranging from about 0.1 Wh/kg to about 500 Wh/kg. In some embodiments, the inorganic layers of the present disclosure have an energy density ranging from about 0.1 Wh/kg to about 100 Wh/kg. In some embodiments, the inorganic layers of the present disclosure have an energy density ranging from about 0.1 Wh/kg to about 10 Wh/kg. In some embodiments, the inorganic layers of the present disclosure have an energy density ranging from about 0.1 Wh/kg to about 1 Wh/kg. In some embodiments, the inorganic layers of the present disclosure have an energy density of about 0.6 Wh/kg.

In some embodiments, the inorganic layers of the present disclosure have a power density ranging from about 1 kW/kg to about 100 kW/kg. In some embodiments, the inorganic layers of the present disclosure have a power density of more than about 20 kW/kg. In some embodiments, the inorganic layers of the present disclosure have a power density ranging from about 1 kW/kg to about 50 kW/kg. In some embodiments, the inorganic layers of the present disclosure have a power density ranging from about 1 kW/kg to about 10 kW/kg. In some embodiments, the inorganic layers of the present disclosure have a power density of about 8 kW/kg.

The inorganic layers of the present disclosure can also have various advantageous mechanical and structural properties. For instance, in some embodiments, the inorganic layers of the present disclosure may be flexible.

In some embodiments, the inorganic layers of the present disclosure may be freestanding. In some embodiments, the inorganic layers of the present disclosure may be positioned directly on a surface of an insulating substrate. In some embodiments, the inorganic layers of the present disclosure may be positioned directly on a surface of one or more adhesion layers associated with an insulating substrate. In some embodiments, the inorganic layers of the present disclosure may be positioned directly on a surface of one or more conductive layers associated with an insulating substrate.

In some embodiments, the inorganic layers of the present disclosure may have a three-dimensional structure. In some embodiments, the three-dimensional structure can include a rolled structure. In some embodiments, the three-dimensional structure can include a coiled structure. In some embodiments, the three-dimensional structure can include a conformal structure (e.g., a structure made conformal with a package).

Separation of Inorganic Layers from Conductive Films

In some embodiments, the methods of the present disclosure also include a step of separating a formed inorganic layer from a conductive film. In some embodiments, the separated inorganic layer is freestanding. Additional embodiments of the present disclosure pertain to the freestanding inorganic layers.

Various methods may be utilized to separate formed inorganic layers from a conductive film. For instance, in some embodiments, the inorganic layers of the present disclosure are separated from a conductive film by mechanical methods. In some embodiments, the separation occurs by the utilization of a mechanical tool, such as a tweezer.

Formed Conductive Films

The methods of the present disclosure can be utilized to form various types of conductive films. Additional embodiments of the present disclosure pertain to the formed conductive films.

In some embodiments, the conductive film includes an insulating substrate, and an inorganic layer associated with the insulating substrate. As described previously, the conductive films of the present disclosure may include various insulating substrates and inorganic layers. As also described previously, the conductive films of the present disclosure can be associated with one or more adhesion layers and one or more conductive layers in various arrangements.

The conductive films of the present disclosure can have various shapes and sizes. For instance, in some embodiments, the conductive films of the present disclosure can have circular, oval, square, hexagonal, rectangular, coiled, rolled, conformal, or irregular shapes. In some embodiments, the conductive films of the present disclosure can have surface areas that range from about 1 mm$^2$ to about 10 m$^2$. In some embodiments, the conductive films of the present disclosure can have a flexible structure. In some embodiments, the conductive films of the present disclosure can have a rigid structure. Additional shapes, sizes and structures can also be envisioned.

The conductive films of the present disclosure can have various thicknesses. For instance, in some embodiments, the conductive films of the present disclosure have thicknesses ranging from about 1 µm to about 1 m. In some embodiments, the conductive films of the present disclosure have thicknesses ranging from about 10 µm to about 10 mm. In some embodiments, the conductive films of the present disclosure have thicknesses ranging from about 10 µm to about 1 mm. In some embodiments, the conductive films of the present disclosure have thicknesses ranging from about 100 µm to about 200 µm. In some embodiments, the conductive films of the present disclosure have a thickness of about 70 µm. In some embodiments, the conductive films of the present disclosure have a thickness of about 100 µm. In some embodiments, the conductive films of the present disclosure have a thickness of about 170 µm.

Incorporation of Conductive Films and Inorganic Layers into an Electronic Device In some embodiments, the methods of the present disclosure also include steps of incorporating the formed conductive films and inorganic layers of the present disclosure into an electronic device. In additional embodiments, the present disclosure pertains to electronic devices that contain the conductive films and inorganic layers of the present disclosure.

The conductive films and inorganic layers of the present disclosure can be incorporated into various electronic devices. In some embodiments, the electronic devices of the present disclosure include, without limitation, energy storage devices, electrodes, electrode systems, batteries, lithium-ion batteries, supercapacitors, electrochemical capacitors, microsupercapacitors, pseudocapacitors, electric double-layer capacitors, fuel cells, micro-circuits, semiconductors, transistors, portable electronic devices, flexible electronic devices, and combinations thereof.

In some embodiments, the conductive films and inorganic layers of the present disclosure are incorporated into batteries, such as lithium-ion batteries. In some embodiments, the conductive films and inorganic layers of the present disclosure are incorporated into fuel cells, such as solar fuel cells. In some embodiments, the conductive films and inorganic layers of the present disclosure are incorporated into electrode systems, such as two-electrode symmetrical cells or devices, three-electrode systems, two-electrode symmetric supercapacitor devices, and combinations thereof.

Electronic devices that contain the conductive films and inorganic layers of the present disclosure can have various advantageous properties. For instance, in some embodiments, the electronic devices of the present disclosure have an energy density ranging from about 10 Wh/kg to about 500 Wh/kg. In some embodiments, the electronic devices of the present disclosure have an energy density ranging from about 100 Wh/kg to about 500 Wh/kg. In some embodiments, the electronic devices of the present disclosure have an energy density of about 384 Wh/kg.

In some embodiments, the electronic devices of the present disclosure have a capacitance ranging from about 1 mF/cm$^2$ to about 1,000 mF/cm$^2$. In some embodiments, the electronic devices of the present disclosure have a capacitance ranging from about 10 mF/cm$^2$ to about 100 mF/cm$^2$. In some embodiments, the electronic devices of the present disclosure have a capacitance of about 66 mF/cm$^2$.

In some embodiments, the electronic devices of the present disclosure have a power density ranging from about 1 kW/kg to about 200 kW/kg. In some embodiments, the electronic devices of the present disclosure have a power density ranging from about 10 kW/kg to about 200 kW/kg. In some embodiments, the electronic devices of the present disclosure have a power density of about 112 kW/kg.

Association of Conductive Films or Inorganic Layers with a Solid Electrolyte

In some embodiments, the methods of the present disclosure also include a step of associating the formed conductive films or inorganic layers of the present disclosure with a solid electrolyte. In some embodiments, the conductive films and inorganic layers of the present disclosure may be associated with a solid electrolyte prior to their incorporation into an electronic device.

The conductive films and inorganic layers of the present disclosure may be associated with various types of solid electrolytes. For instance, in some embodiments, the solid electrolyte includes, without limitation, lithium-based solid electrolytes, polymer-based solid electrolytes, and combinations thereof. In some embodiments, the solid electrolytes include organic polymers (e.g., polyvinyl alcohol) and electrolyte salts (e.g., potassium hydroxide) at various weight ratios (e.g., weight ratios of 1:1, 2:3, 4:3, or 5:3).

Figure 1C:
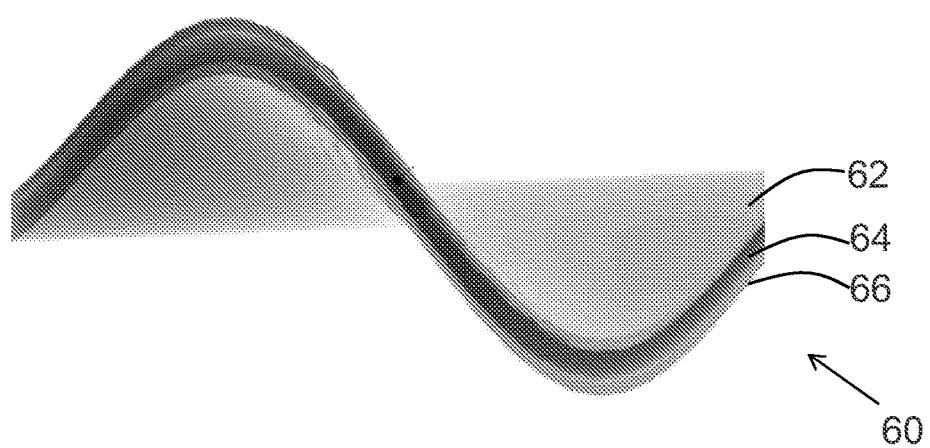
FIG. 1C provides an illustration of an electronic device component that is associated with conductive films.

In some embodiments, the association of a conductive film or an inorganic layer with a solid electrolyte results in formation of an electronic device component (e.g., electronic device component 60 in FIG. 1C). The formed electronic device components can have various thicknesses. For instance, in some embodiments, the formed electronic device components can have a thickness ranging from about 100 μm to about 500 μm. In some embodiments, the formed electronic device components have a thickness of about 170 μm.

In some embodiments, the electronic device component is an electrode. In some embodiments, the electronic device component is then incorporated into an electronic device.

In some embodiments, a solid electrolyte may be associated with a first conductive film. In some embodiments, a solid electrolyte may be associated with a first conductive film and a second conductive film. In some embodiments, a solid electrolyte may first be associated with a first conductive film and then associated with a second conductive film. In some embodiments, a first surface of a solid electrolyte is positioned above an inorganic layer of a first conductive film. Thereafter, a second surface of the solid electrolyte is positioned above an inorganic layer of a second conductive film. In some embodiments, the first and second surfaces of the solid electrolyte are on opposite sides of one another. An example of the aforementioned embodiment is illustrated in FIG. 1C, where two conductive films (e.g., first conductive film 62 and second conductive film 66) are placed on opposite surfaces of a solid electrolyte (e.g., solid electrolyte 64).

In some embodiments, the first and second conductive films include the same components (e.g., the same inorganic layer). In some embodiments, the first and second conductive films include different components (e.g., different inorganic layers).

Applications and Advantages

The present disclosure provides various advantages. For instance, the methods of the present disclosure can be utilized to make conductive films and freestanding inorganic layers in a cost effective, scalable, and efficient manner. Moreover, as described previously, the conductive films and inorganic layers of the present disclosure can have various advantageous electrical, structural, and mechanical properties. For instance, in some embodiments, the inorganic layers of the present disclosure can deliver battery-like thin-film supercapacitive performance. Moreover, in some embodiments, the inorganic layers of the present disclosure can maintain their high performance under numerous cycles and different bending conditions. For instance, in some embodiments, the inorganic layers of the present disclosure can maintain their high performance after 10,000 cycles.

In some embodiments, the conductive films and inorganic layers of the present disclosure can have different uses. For instance, in some embodiments, the conductive films and inorganic layers of the present disclosure can respond as supercapacitors if charged quickly and like batteries if charged slowly.

As such, the inorganic layers and conductive films of the present disclosure can be incorporated into various electronic devices for numerous applications. For instance, in some embodiments, the methods of the present disclosure can be utilized in a scalable manner for the mass production of conductive films and inorganic layers for various applications, including use as freestanding all-solid-state electrodes, and components of various machineries, such as automobiles, aircraft, and trains.

Additional Embodiments

Reference will now be made to more specific embodiments of the present disclosure and experimental results that provide support for such embodiments. However, Applicants note that the disclosure herein is for illustrative purposes only and is not intended to limit the scope of the claimed subject matter in any way.

EXAMPLE 1

Flexible 3-Dimensional Nanoporous Metal-Based Energy Devices

In this Example, a flexible 3-dimensional (3-D) nanoporous NiF$_2$-dominant layer on poly(ethylene terephthalate) has been developed. The nanoporous layer itself can be freestanding without adding any supporting carbon materials or conducting polymers. By assembling the nanoporous layer into two-electrode symmetric devices, the inorganic material delivers battery-like thin-film supercapacitive performance with a maximum capacitance of 66 mF cm$^{-2}$ (733 F cm$^{-3}$ or 358 F g$^{-1}$), energy density of 384 Wh kg$^{-1}$, and power density of 112 kW kg$^{-1}$. Flexibility and cyclability tests show that the nanoporous layer maintains its high performance under long-term cycling and different bending conditions. The fabrication of the 3-D nanoporous $NiF_2$ flexible electrode could be easily scaled.

In this Example, Applicants also provide a technique to fabricate 3-D nanoporous $NiF_2$-dominant flexible thin film energy storage devices. The fabricated thin film can be freestanding without support from other carbon materials and conducting polymers. $NiF_2$ was used in this Example due to the large operation potential window of metal fluorides.

Figure 2:
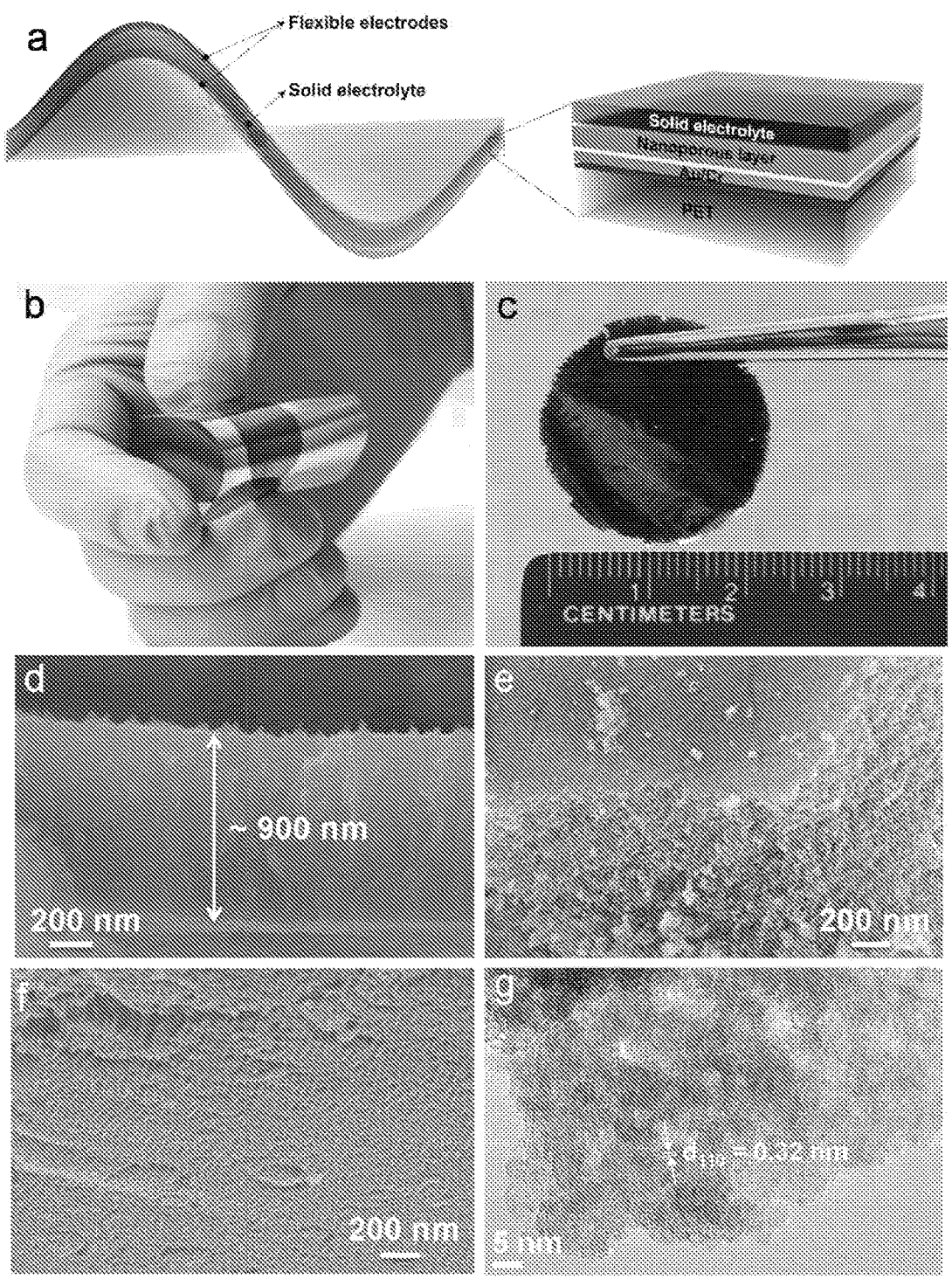
FIG. 2 provides a structure of a three-dimensional nanoporous layer (NPL) and electrode schematic.

To fabricate flexible devices based on nanoporous $NiF_2$-dominant thin film electrodes for supercapacitor applications, nickel was electrodeposited on Au/Cr/polyethylene terephthalate (PET) substrates (FIG. 2A). Anodization was then used to electrochemically etch the deposited nickel to form a 3-D nanoporous structure.

Figure 3:
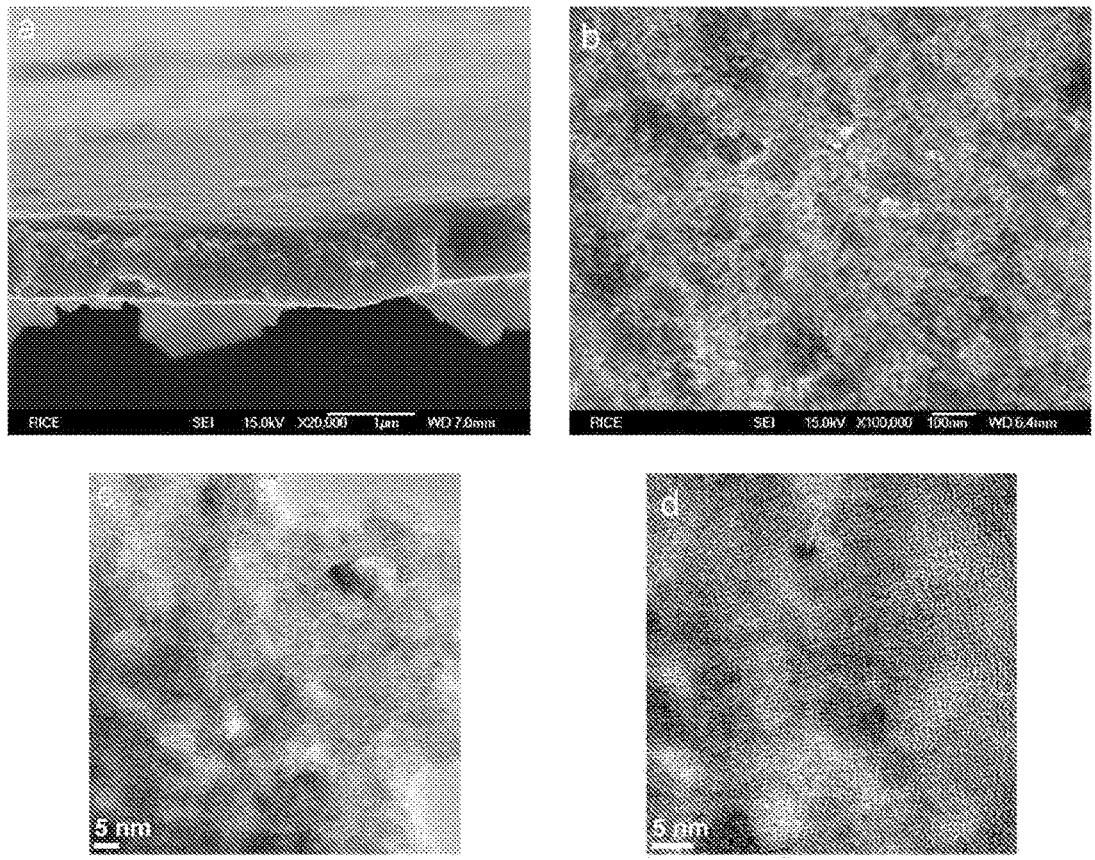
FIG. 3 provides microscopic observations of the NPL, including a cross section SEM image in low magnification (FIG. 3A), a cross section SEM image in high magnification (FIG. 3B), and TEM images (FIGS. 3C-D).

The as-prepared 3-D nanoporous layer (NPL) on the substrate showed good flexibility (FIG. 2B) due to the enhanced mechanical properties conveyed by the nanoporous structure. The NPL became freestanding after removal of the substrate (FIG. 2C). The fabricated thin film with the NPL had a thickness of about 900 nm and an average pore size of about 5 nm, as confirmed by scanning electron microscopy (SEM) observations from different viewing directions: cross sectional (FIGS. 2D, 3A and 3B), top (FIG. 2E) and bottom (FIG. 2F). The NPL with an average pore size of about 5 nm was also observed by transmission electron microscopy (TEM, FIGS. 2G, 3C, and 3D).

Figure 4:
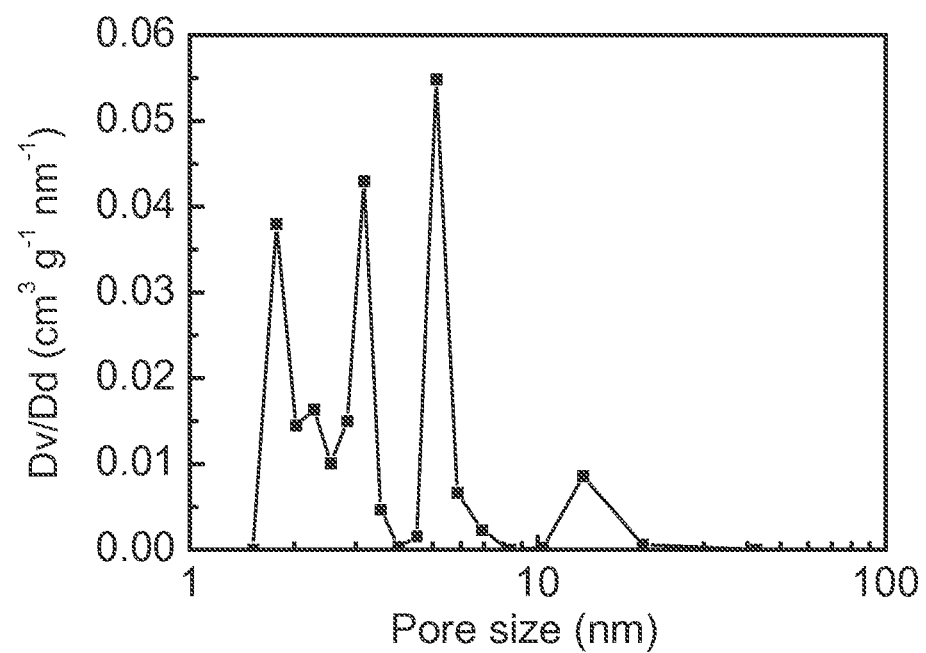
FIG. 4 provides Barrett-Joyner-Halenda (BJH) pore size distribution derived from the adsorption branch of the isotherm of the heterogeneous NPL.

The identified d-spacing from high resolution TEM (HR-TEM) was ~0.32 nm, which corresponds to the $NiF_2$ (110) plane, as indicated by the lattice fringes (FIG. 2G). To investigate the porous structure of the NPL, Brunauer-Emmett-Teller (BET) analysis by adsorption/desorption of nitrogen gas was performed. The data was used to determine the Barrett-Joyner-Halenda (BJH) pore size. Nanoscale pores distributed mainly in a range from 2 to 10 nm were observed (FIG. 4). X-ray photoelectron spectroscopy (XPS) analysis (FIG. 5) also confirms that the as-prepared NPL is mainly composed of Ni and F. The Ni2p spectrum indicates Ni is mostly bound to F to form $NiF_2$. The detected O1s and $C_1s$ spectra are from the adsorbed moisture and $CO_2$ from the atmosphere.

To discover reasonable EC testing conditions for the flexible NPL in the two-electrode symmetric devices, different potential windows (FIG. 6) and compositions of solid electrolytes (Table 1 and FIGS. 7-11) were screened. The optimum solid electrolyte composition for the NPL was found to be KOH in poly(vinyl alcohol) (PVA, molecular weight of ~50,000) with a weight ratio ~1:1. The operating potential windows were set within −0.8 to 0.8 V (narrow potential window, NPW) and −1.4 to 1.4 V (wide potential window, WPW).

TABLE 1

The variation in the ECs performance with different compositions of the solid electrolyte.

| Composition (weight ratio) | EDLCs (mF) at 0.1 mA cm$^{-2}$ | Pseudocapacitance (mF) at 1 mA cm$^{-2}$ | ESR (ohm) |
| --- | --- | --- | --- |
| PVA (100 k):KOH = 2:3 | 0.35 | 31 | 12.5 |
| PVA (100 k):KOH = 1:1 | 1.3 | 112 | 9.2 |
| PVA (50 k):KOH = 2:3 | 0.35 | 47 | 4.8 |
| PVA (50 k):KOH = 1:1 | 1.1 | 251 | 2.8 |
| PVA (50 k):KOH = 4:3 | 0.96 | 118 | 3.5 |
| PVA (50 k):KOH = 5:3 | 0.51 | 133 | 4.6 |

Figure 12:
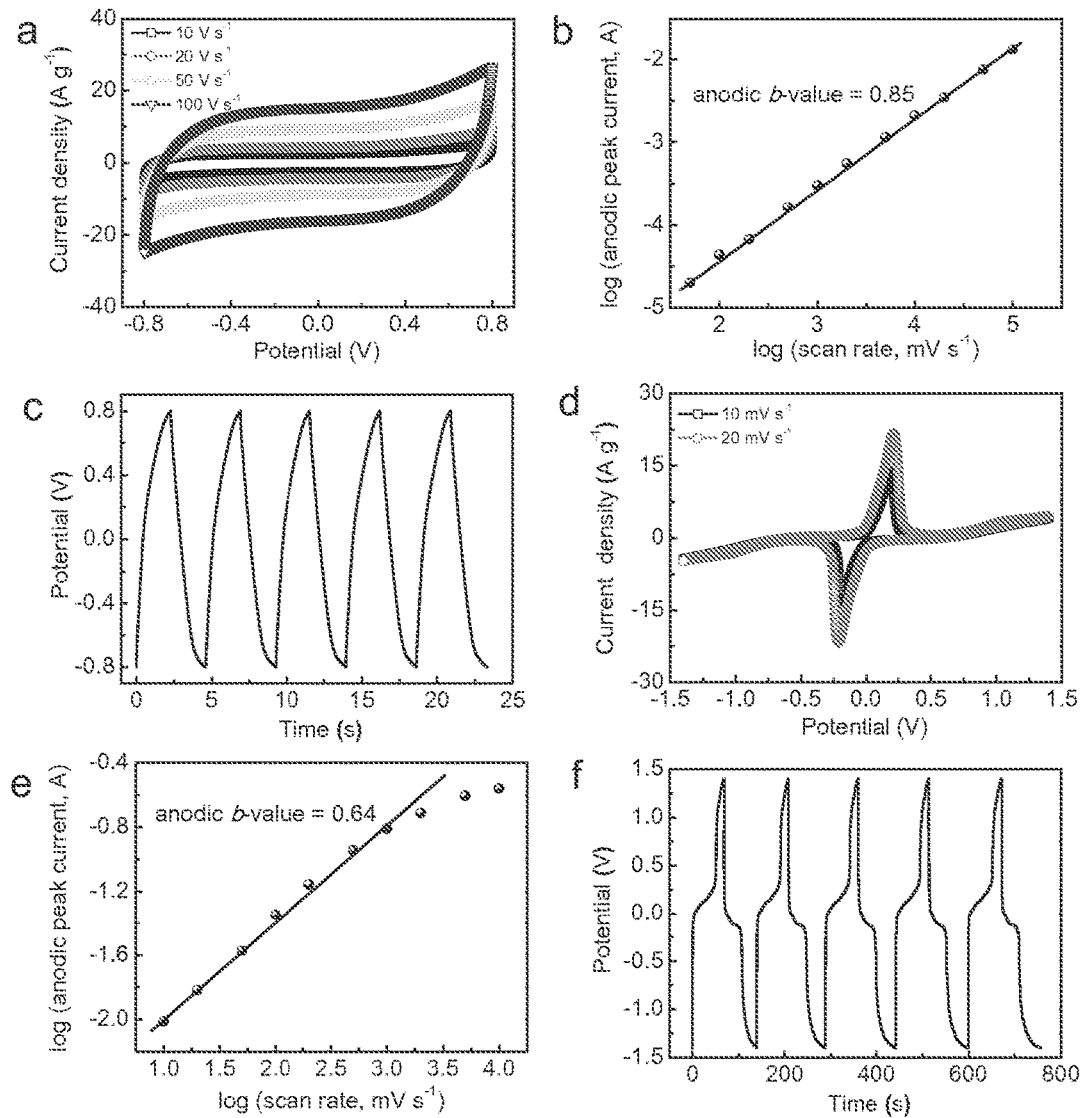
FIG. 12 shows electrochemical capacitor (EC) performances of the NPL in two-electrode symmetric devices within different potential windows: NPW (−0.8 to 0.8 V) (FIGS. 12A-C) and WPW (−1.4 to 1.4 V) (FIGS. 12D-F).
Figure 13:
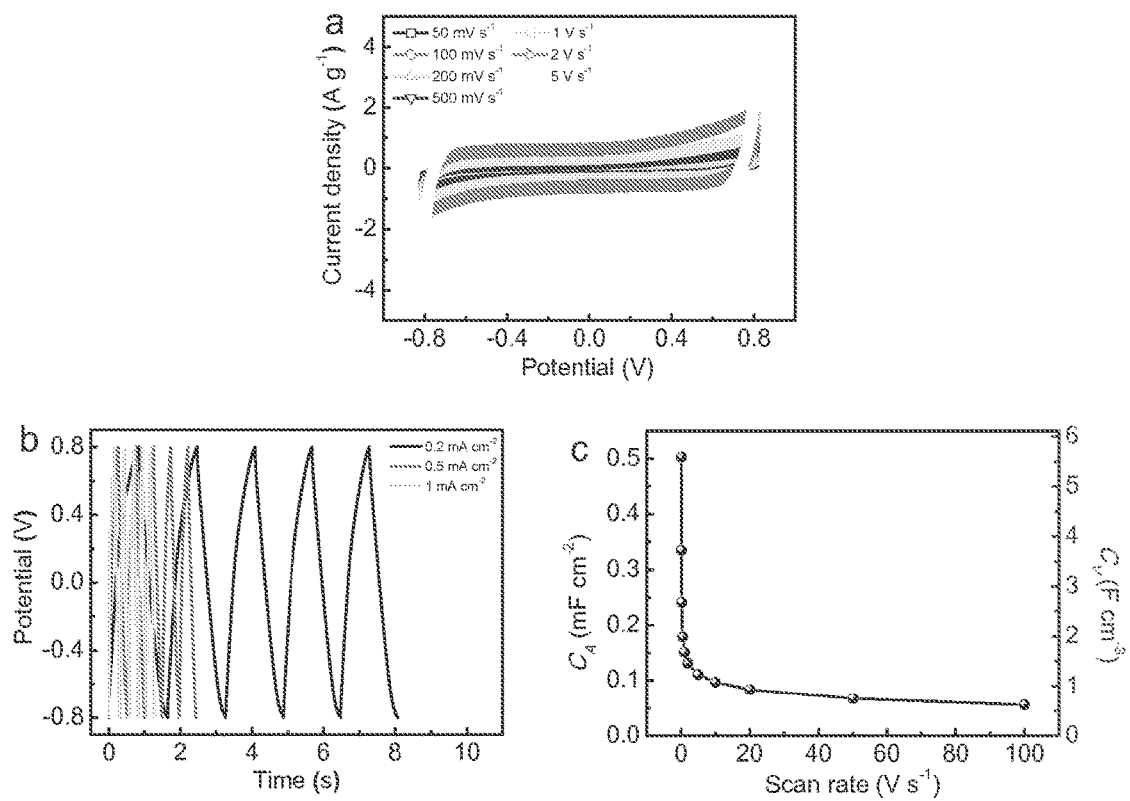
FIG. 13 provides EC testing on the devices within a potential window from −0.8 to 0.8 V by using a solid electrolyte composed of KOH in PVA (molecular weight of ~50 k) with a weight ratio ~1:1.

When testing in a NPW, a NPL can only behave as an EDLC by electrostatic adsorption in the 3-D nanoporous structure. However, operating in a WPW, the window is sufficient to trigger an electrochemical conversion from $NiF_2$ to $Ni(OH)_2$ at ~1 to 1.2 V depending on the scan rate. Notably, the NPL shows a typical EDLC behavior that is a quasi-rectangular shape in the cyclic voltammograms (CVs), even at high scan rates of 100 V s$^{-1}$ (FIGS. 12A and 13A). The data establishes that the nanoporous structure of the NPL is responsible for the electrostatic adsorption effect during testing and the high electric conductivity of the devices mitigates the polarization effect during CV testing even at high scan rates up to 100 V s$^{-1}$. By fitting a log (anodic peak current)-log (scan rate) plot (FIG. 12B), a b-value of 0.85 was obtained, which indicates that a surface-controlled electrode process (for capacitive, b=1) dominates in the device.

The quasi-triangle shape in galvanostatic discharge/charge (GDC) curves (FIGS. 12C and 13B) also indicates the EDLC behavior of the NPL. The $C_A/C_V$ (based on the size of the NPL) calculated from CVs (FIG. 13C) can reach up to 0.5 mF cm$^{-2}$ (5.6 F cm$^{-3}$ or 2.7 F g$^{-1}$) at a scan rate of 50 mV s$^{-1}$. On the other hand, $C_A/C_V$ calculated from the GDC curve (FIG. 12C) is 0.29 mF cm$^{-2}$ (3.2 F cm$^{-3}$ or 1.57 F g$^{-1}$) at 0.1 mA cm$^{-2}$ (0.54 A g$^{-1}$).

Figure 14:
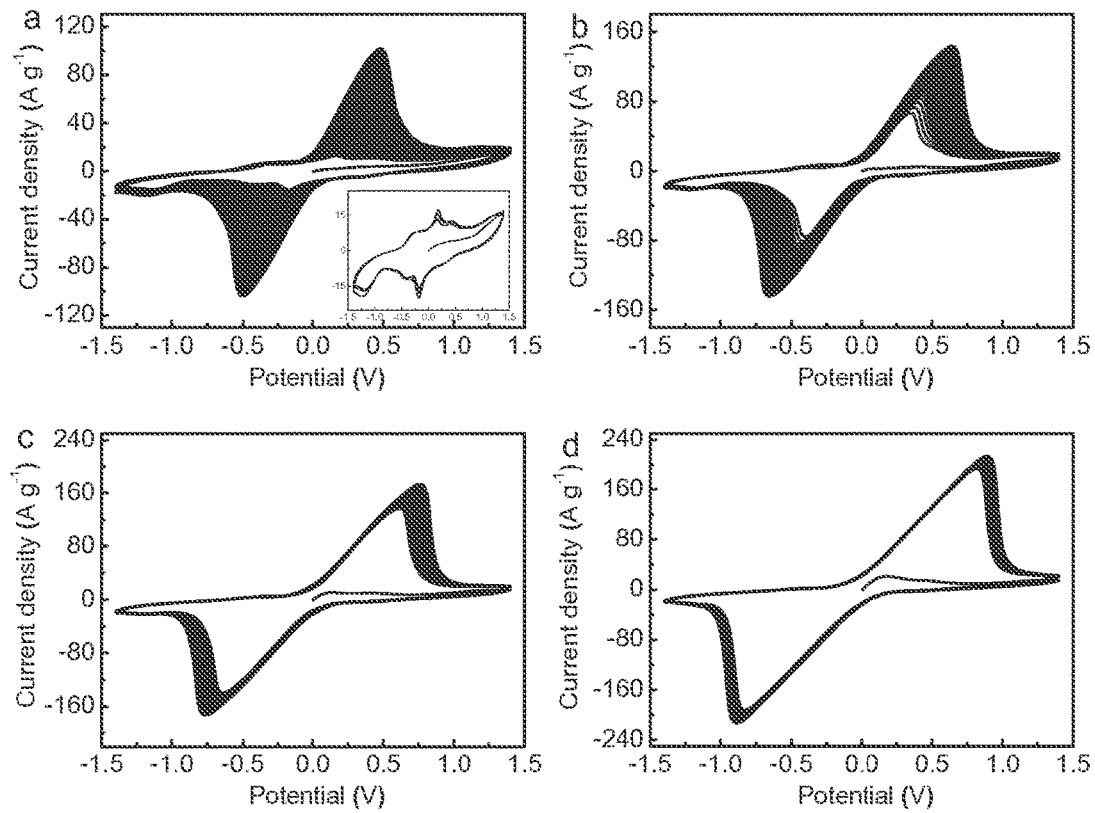
FIG. 14 provides an activation process by CVs at 1 V s$^{-1}$ for over 400 cycles.
Figure 15:
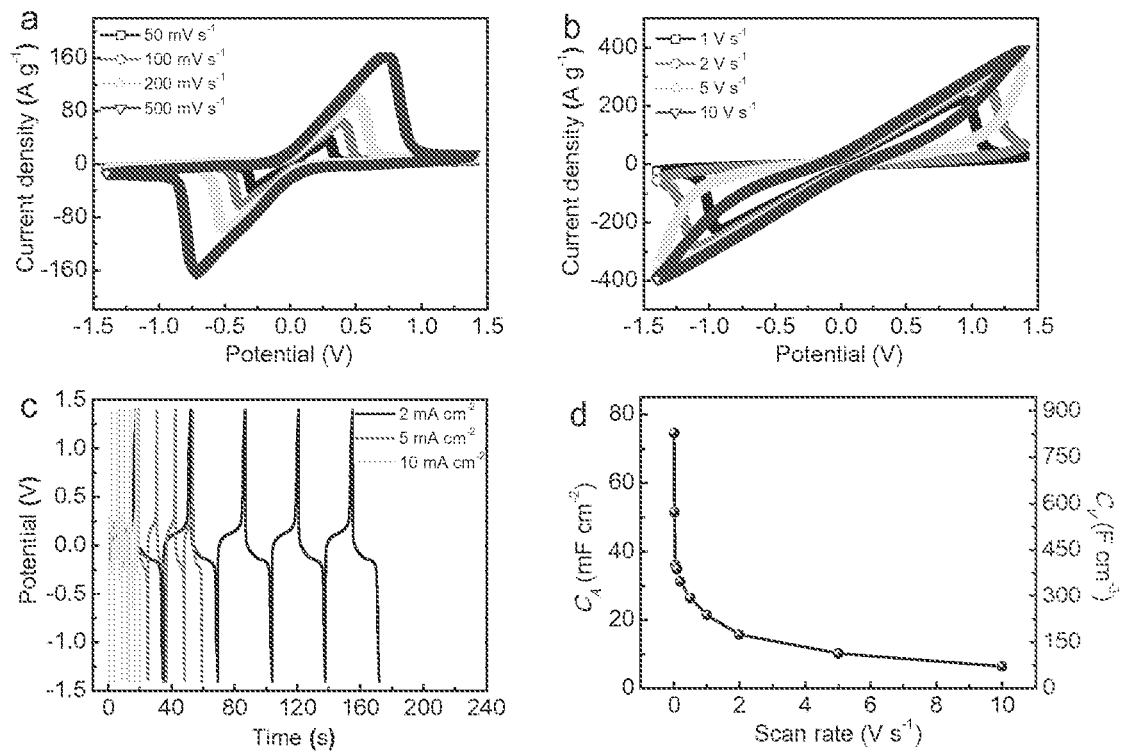
FIG. 15 provides EC testing on the devices within the potential window from −1.4 to 1.4 V by using a solid electrolyte composed of KOH in PVA (molecular weight of about 50 k) with a weight ratio about 1:1.

To convert $NiF_2$ to $Ni(OH)_2$, an activation process is initiated by cyclic voltammetry within a WPW (FIG. 14). It is clear from the CVs (FIGS. 12D and 15A-B) that a pair of redox peaks at anodic (0.19 V) and cathodic (−0.19 V) sweeps appear after activation. The widening potential difference (ΔV) between the anodic and cathodic peaks with increased scan rates indicates that a diffusion-controlled process dominates the electrode reactions. b=0.64, obtained after fitting (FIG. 12E) also indicates that a diffusion-controlled process (b=0.5) dominates the electrode reactions. Furthermore, a pair of battery-like plateaus at 0.2/−0.2 V were found from GDC curves (FIGS. 12F and 15C), which originated from anion (OH$^-$) intercalation and the reversible reactions between Ni(II) and Ni(III) (i.e., Ni$(OH)_2$+OH$^-$⇌NiOOH+$H_2O$+e$^-$).

The energy storage mechanism of the fabricated devices is similar to that of a Ni-Cd battery. The $C_A/C_V$ calculated from the CVs (FIG. 15D) and GDC curves are 75 mF cm$^{-2}$ (833 F cm$^{-3}$ or 407 F g$^1$) at scan rate of 50 mV s$^{-1}$ and 66 mF cm$^{-2}$ (733 F cm$^{-3}$ or 358 F g$^{-1}$) at 1 mA cm$^{-2}$ (5.4 A g$^{-1}$, FIG. 12F), which is significantly higher than those found in flexible electrodes made with carbonaceous materials such as graphene/polyaniline composites (135 F cm$^{-3}$ at 2 mV s$^{-1}$), carbon nanotubes (less than 16 F cm$^{-3}$ at 1 mV s$^{-1}$) and carbide-derived carbon materials (up to 90 F cm$^{-3}$ at 1 mA cm$^{-2}$).

Furthermore, electrochemical impedance spectroscopy (EIS) was used to investigate the kinetic processes of the electrode reactions in the flexible devices. Nyquist plots (FIG. 16A) for the NPL measured at the open circuit potential (OCP) illustrate an equivalent series resistance (ESR, the intersection with the real axis) of ~2.8 Ω, which indicates a high ionic conductivity of the solid electrode and low interface resistance between the NPL and solid electrolyte. The capacitance response frequency for the flexible device at a phase angle of −45° ($\phi_{45}$) was found to be 800 Hz from bode plot (FIG. 16B), which is equivalent to a relaxation time constant ($\tau_0$)~1.25 ms. This indicates that pseudocapacitive behavior and stored energy are accessible at frequencies below 800 Hz.

Figure 16:
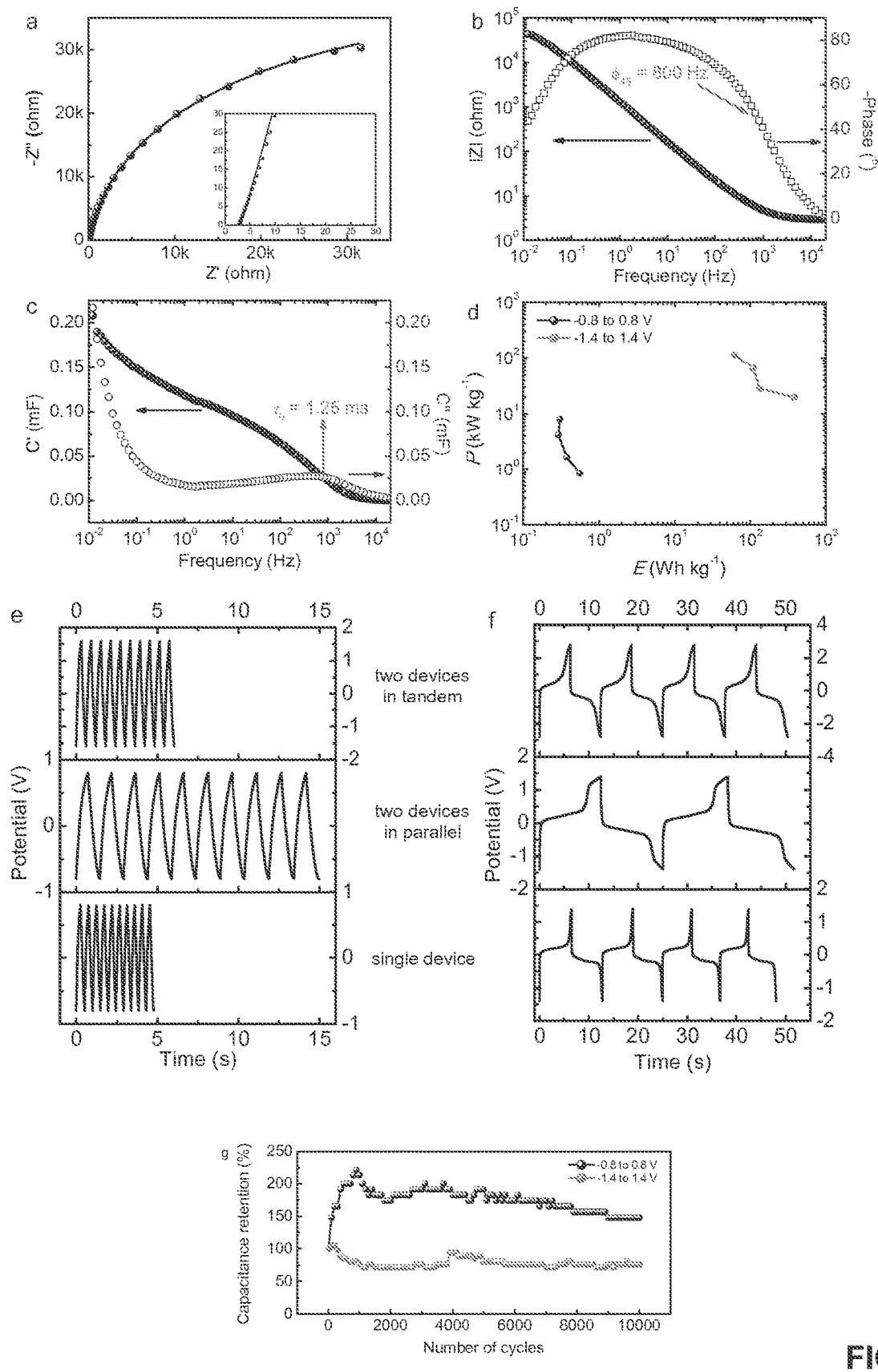
FIG. 16 shows EC performance of the NPL.

At 2 Hz, the phase angle for the device is about −82°, which is close to ideal capacitive behavior)(−90°. Moreover, $\tau_0$ calculated from the plot of frequency-dependent imaginary capacitance (C″) is consistent with that calculated from the bode plot (i.e. 1.25 ms) (FIG. 16C). It is notable that the $\tau_0$ of 1.25 ms obtained in this Example is much lower than those found in most recently published reports, for example graphene (33 ms), carbon-onions (26 ms), and $MnO_x/Au$ multilayers (4.7 ms).

For comparison, the Ragone plot (FIG. 16D) was plotted in areal/volumetric power density ($P_A/P_V$) vs. areal/volumetric energy density ($E_A/E_V$) for the NPL tested in both the NPW (−0.8 to 0.8 V) and WPW (−1.4 to 1.4 V). The maximum $P_A$ and $E_A$ tested in the NPW are 8 kW $kg^{-1}$ and 0.6 Wh $kg^{-1}$, respectively. The values increase to 112 kW $kg^{-1}$ and 384 Wh $kg^{-1}$, respectively, when being tested in a WPW. Compared to flexible EC devices based on EDLCs such as carbon nanotubes, the NPL delivers better specific power and energy density in the NPW. Furthermore, the NPL shows much higher power supply performance in WPWs than that of pseudocapacitors recently published. Table 2 shows an EC performance comparison with some of the state-of-the-art thin film or flexible supercapacitors.

TABLE 2

ECs performance of the NPL compared with state-of-the-art thin film or flexible electrodes for supercapacitors.

| Flexible electrodes | Discharge conditions | $C_A$ (mF $cm^{-2}$) | $C_V$ (F $cm^{-3}$) |
|---|---|---|---|
| NPL in this work | 1 mA $cm^{-2}$/ 50 mV $s^{-1}$ | 66/75 | 733/833 |
| Multi-wall carbon nanotubes (MWCNTs)/$MnO_2$[10] | 10 mV $s^{-1}$ | — | 246 |
| MWCNTs[11] | 50 mV $s^{-1}$ | — | 132 |
| Ni(OH)$_2$ on graphite foam[12] | 0.5 A $g^{-1}$ | — | 93.5 |
| Hydrogenated $TiO_2$ nanotubes[13] | 100 mV $s^{-1}$ | 3.24 | — |
| Biscrolled yarn[14] | 1 V $s^{-1}$ | 73 | 179 |
| Metal oxide nanoparticles in carbon nanotubes[15] | 100 mV $s^{-1}$ | — | 1.26 |

From a practical view, the EC performance of a flexible device is better measured when it is connected both in tandem and in parallel. It is clear that doubled operation potential windows and GDC durations are obtained from the devices tested within both NPW (FIG. 16E) and WPW (FIG. 16F) in tandem and parallel connections, respectively. To characterize the cyclability of the devices, 10,000 GDC cycles (FIG. 16G) were performed within both a NPW (at 1 mA $cm^{-2}$ or 5.4 A $g^{-1}$) and WPW (at 2 mA $cm^{-2}$ or 10.8 A $g^{-1}$). It is notable that the capacitance increased to 220% during the initial 900 cycles in a NPW, which likely indicates a gradual increase in electrochemically active surface area or surface passivation.

Figure 17:
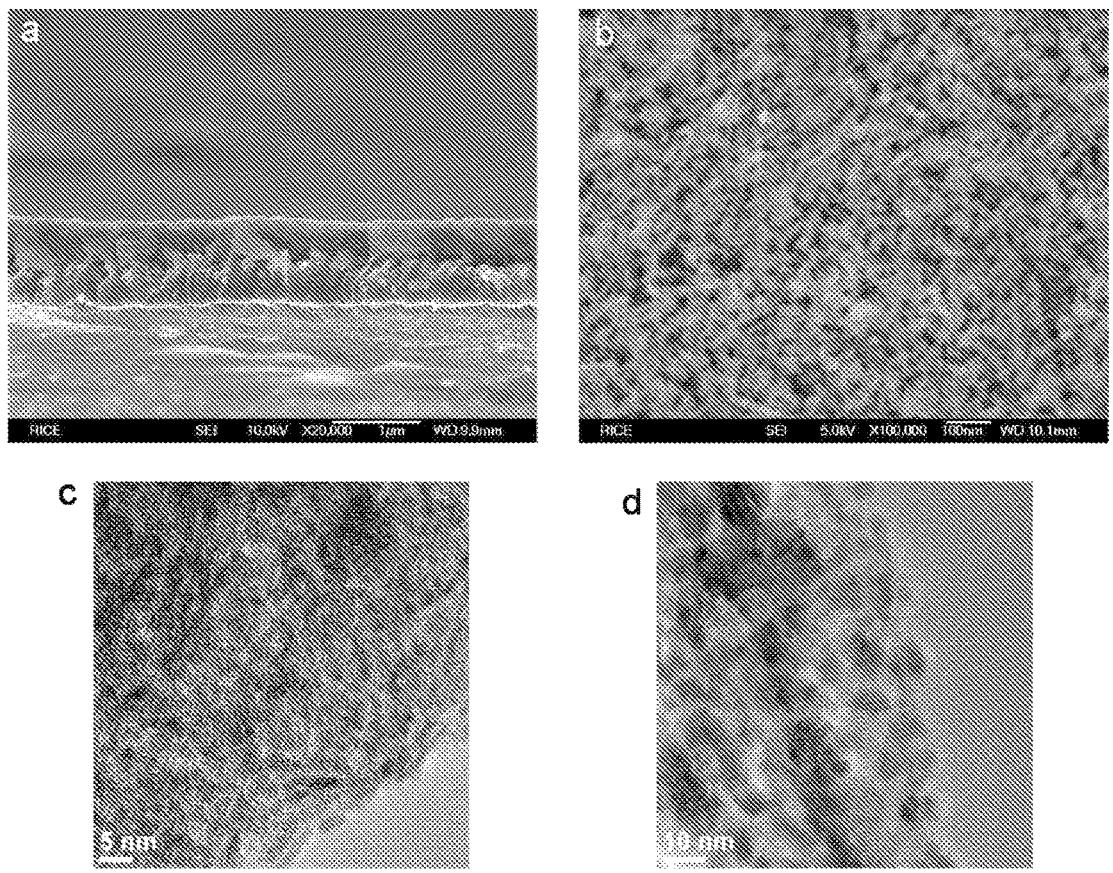
FIG. 17 provides microscopy observation of the NPL after 10,000 GDC cycles.
Figure 18:
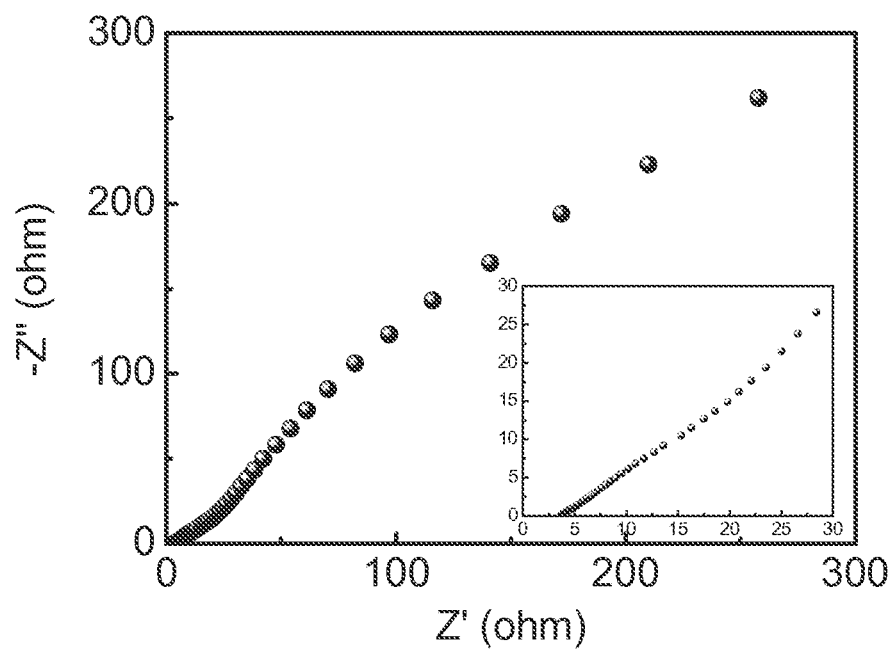
FIG. 18 shows Nyquist plot of the NPL after 10,000 GDC cycles. The inset shows enlarged high frequency region.

After 900 cycles, the capacitance gradually decreased and finally stabilized at 150% after 10,000 cycles, which is still higher than the initial capacitance. Similarly, when being tested within the WPW, the devices increased to 105% for the initial 300 cycles and then decreased and stabilized at 76% retention after 10,000 cycles. This indicates that the delivered capacitance based on both EDLCs (NPW) and faradaic reactions (WPW) can maintain over 75% of the initial value over long-term testing, which is promising for practical applications. A more important feature is that after 10,000 cycles of testing, the NPL still maintained its nanoporous structure (FIG. 17), and no decay of the layer was observed. Moreover, after cyclability testing, the ESR increased to only 3.8 Ω (FIG. 18), which indicates that the EC testing did not significantly change the solid electrolyte/NPL interface.

Figure 19:
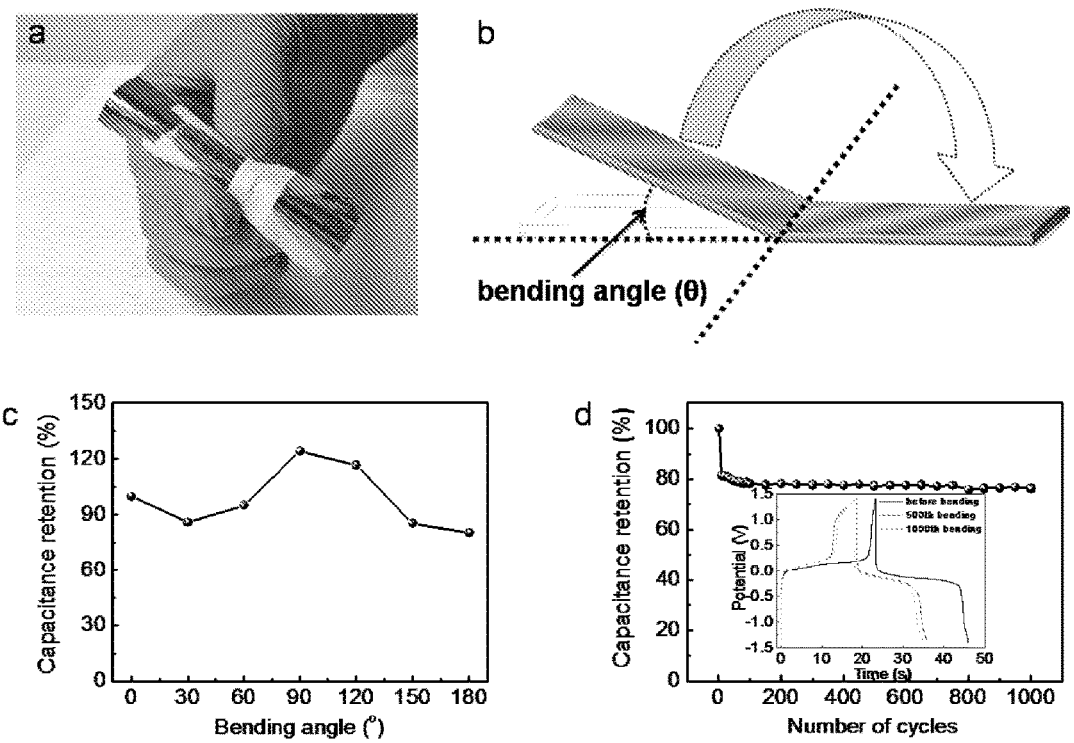
FIG. 19 shows flexibility tests on the NPL based EC devices.
Figure 20:
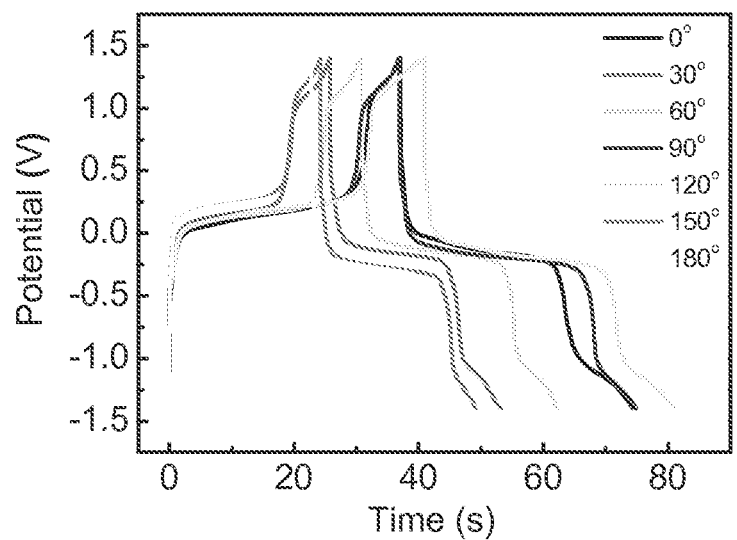
FIG. 20 shows data relating to the dependence of EC performance on the bending angle.
Figure 21:
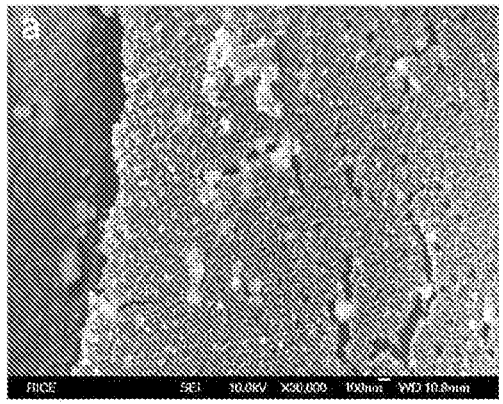
FIG. 21 shows microscopic observations of the NPL grown from different electrodeposited metals on PET substrates.
Figure 21:
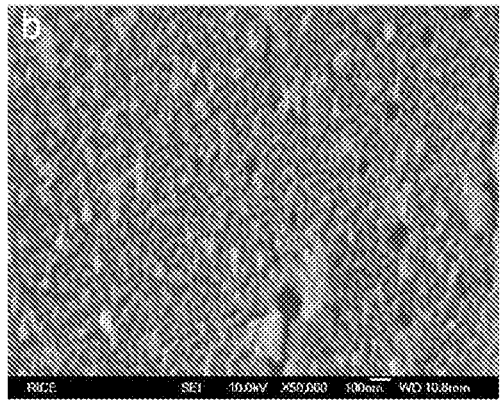
Figure 21:
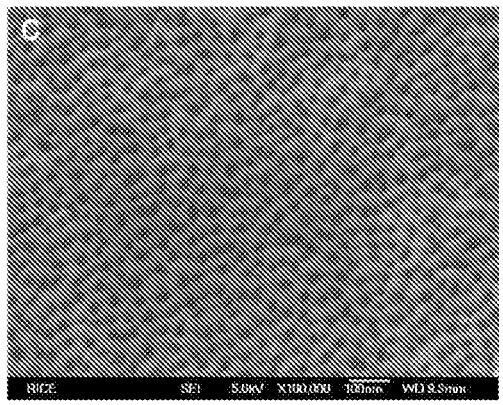
Figure 21:
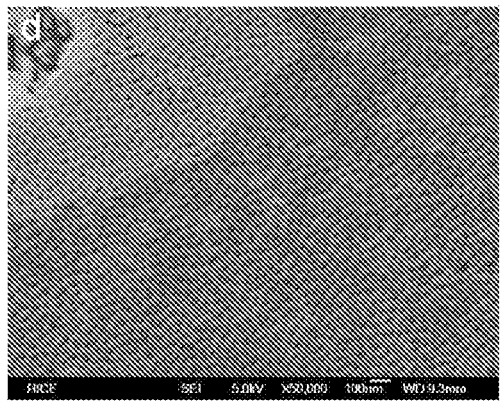

The effect of bending on the EC performance was also measured on the NPL-based devices (FIGS. 19A-B). The delivered capacitance is influenced by the bending angles in a non-linear fashion (FIGS. 19C and 20). At bending angles of 90° and 120°, the capacitance increased to 125% and 117%, while the capacitance retention was 80% at the 180° bending angle. In addition, flexibility tests were carried out by bending a device to 180° 1000 times. The capacitance (FIG. 19D) shows a quick drop after the initial few bending cycles and it was then maintained at 76% capacitance retention. Finally, complementary NPLs based on Fe and Co were prepared using the same fabrication technique (FIG. 21).

In summary, 3-D nanoporous $NiF_2$-dominant thin film grown on PET shows good flexibility and can even be freestanding. The thin film NPL delivers exacting supercapacitive performance with a maximum capacitance of 0.29 mF $cm^{-2}$ (3.2 F $cm^{-3}$ or 1.57 F $g^{-1}$), energy density of 0.6 Wh $kg^{-1}$ and power density of 8 kW $kg^{-1}$ from electrostatic adsorption; and a maximum capacitance of 66 mF $cm^{-2}$ (733 F $cm^{-3}$ or 358 F $g^{-1}$), energy density of 384 Wh $kg^{-1}$ and power density of 112 kW $kg^{-1}$ from faradaic reactions. Flexibility and cyclability tests show that the nanoporous layer maintains its high performance, which is an important advance in flexible devices.

EXAMPLE 1.1

Fabrication of NPLs

Poly(ethylene terephthalate) (PET, ~35 μm thick) was cleaned with 2-propanol (99.5%, Sigma-Aldrich, USA) followed by deionized water. A Fischione 1020 argon/oxygen plasma cleaner was then used to clean the substrates further by exposure for 2 minutes under 600 W power. After that, 10 nm Cr was sputtered on the substrates as the adhesion layer using a Denton Desk V Sputter System, followed by sputtering 40 nm of Au as the conductive layer. Electrochemical deposition was then carried out in an aqueous solution of 0.05 M $NiSO_4$ (99%, Sigma-Aldrich, USA) with 0.5 M $H_3BO_3$ (99.5%, Sigma-Aldrich, USA) to deposit nickel layers on the treated substrates. Further anodic treatments were conducted at 15 mA $cm^{-2}$ in a solution of 0.2 M $NH_4F$ (98%, Sigma-Aldrich, USA) with 2 M deionized water in ethylene glycol (Fisher Scientific, USA) performed in a two-electrode set-up with platinum foil as a counter electrode. The samples were then rinsed with deionized water and dried by nitrogen gas flow.

EXAMPLE 1.2

Device Assembly

In order to enable access to the practical supercapacitor device performance of the fabricated flexible electrode, all-solid-state two-electrode symmetric cells (FIG. 2A) were used instead of three-electrode testing in aqueous solution. A PVA/KOH (weight ratio~1:1) membrane was prepared by dissolving 4.2 g KOH in 50 mL water at room temperature under the $N_2$ atmosphere. Then 4.2 g PVA (50,000 or 100,000 MW) was added to the KOH solution which was heated at 85° C. for 5 hours under rapid stirring. After the PVA/KOH sol became clear, the sol was dried at room temperature in a fume hood for 10 hours to form the PVA/KOH membrane that was ~100 µm thick.

For assembling into a two-electrode symmetric supercapacitor device, two pieces of the NPL electrodes sandwiched a piece of PVA/KOH membrane, the latter being both a solid electrolyte and separator. The entire sandwich including the PET outer layers was ~170 µm thick. The geometrical area of the electrode was 1 cm in diameter (~3.8 $cm^2$) and the mass of the electrode was found to be ~0.7 mg for each piece. To avoid the decay of the dissolved KOH in the solid electrolyte, which can occur by forming carbonates through exposure to atmospheric moisture and $CO_2$ during ECs testing, the edges of the devices were sealed with PTFE tape.

EXAMPLE 1.3

Characterization

A JEOL 6500F scanning electron microscope (SEM) was used to investigate the morphology of the samples. A JEOL 2010 HRTEM was used to observe the morphologies and lattice fringes of the samples. The pore distribution of the NPL was investigated using Brunauer-Emmett-Teller (BET) analysis (Quantachrome Autosorb-3B surface analyzer). The data was used to determine the Barrett-Joyner-Halenda (BJH) pore size. The 20 mg sample was dried at 130 ° C. under vacuum for 17 hours before the test. XPS (PHI Quantera, Perkin Elmer, USA) was used to characterize the chemical composition of the nanoporous layer.

EXAMPLE 1.4

Electrochemical Measurement

The supercapacitor performance of the assembled flexible all-solid-state supercapacitor devices, including galvanostatic discharge/charge (GDC) tests, CVs and EIS analyses, were carried out with an electrochemical analyzer (CHI 608D, CH Instruments, USA). Long-term GDC cycling tests were performed on a multichannel battery analyzer (Land, CT2001A). The EIS were carried out on fresh cells at open circuit potentials with a frequency range from $10^{-2}$ to $10^4$ Hz with an ac signal amplitude of 5 mV.

EXAMPLE 1.5

BET Analysis of the NPL

Brunauer-Emmett-Teller (BET) analysis by adsorption/desorption of nitrogen gas was performed. The data was used to determine the Barrett-Joyner-Halenda (BJH) pore size (FIG. 4). Nanopores distributed from 2 to 10 nm were observed. The pore distribution is consistent with SEM and TEM observations.

EXAMPLE 1.6

XPS Analysis of the NPL

Figure 5:
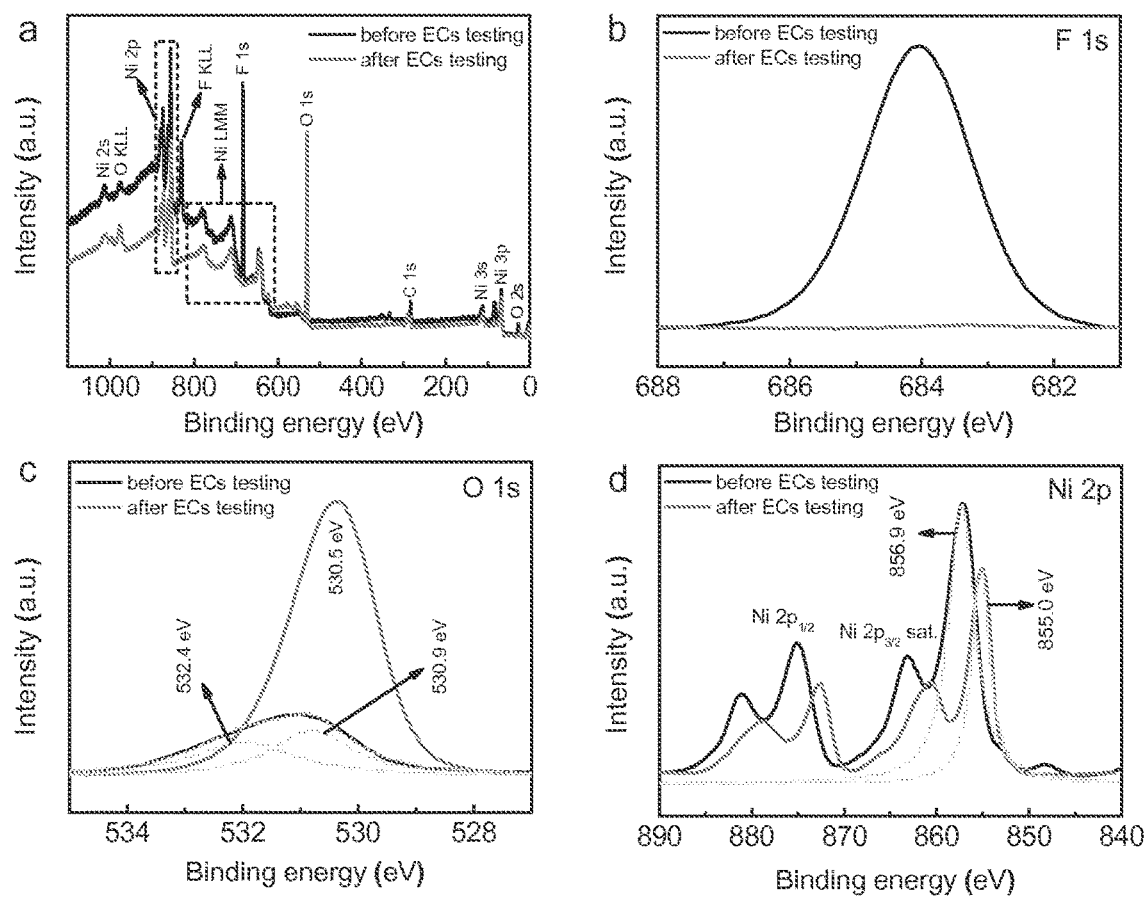
FIG. 5 provides X-ray photoelectron spectroscopy (XPS) analysis on the NPL before (dark lines) and after (light lines) electrochemical capacitor (EC) performance testing. Shown are the XPS full spectra (FIG. 5A), F is spectra (FIG. 5B), O is spectra (FIG. 5C), and Ni 2p spectra (FIG. 5D).

XPS full spectrum scan and fine scan were performed on the NPL to investigate its chemical composition before and after electrochemical testing (activation process). The chemical composition changes are clear from XPS F1s, O1s and Ni2p spectra, as shown in FIG. 5. Before EC testing (black curves), the XPS peaks at 684 eV in F1s, 530.9 and 532.4 eV in O1s, 856.9 eV in $Ni2p_{3/2}$ are ascribed to fluoride in $NiF_2$, oxygen in the surface adsorbed moisture, and nickel in $NiF_2$, respectively. While after EC testing (activation process, red curves), F1s peak disappears, the O1s peak shifts to 530.5 eV and $Ni2p_{3/2}$ peak shifts to 855.0 eV, which corresponds to oxygen and nickel from $Ni(OH)_2$ and NiOOH. Based on the XPS analysis, a probable conversion reaction occurred during EC testing: $NiF_2 + 2KOH \leftrightarrows Ni(OH)_2 + 2KF$. Then the formed $Ni(OH)_2$ is responsible for the reversible redox reactions during discharge/charge testing.

EXAMPLE 1.6

Optimization in Operating Potential Window

Figure 6:
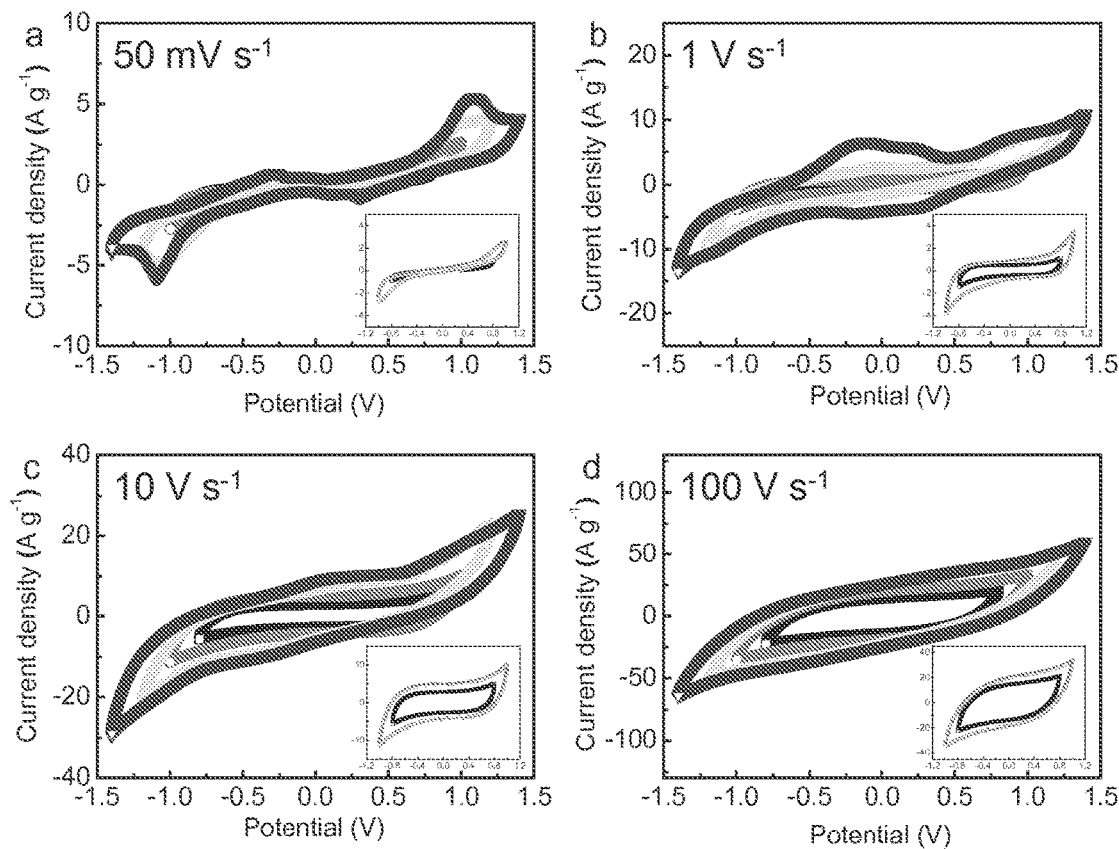
FIG. 6 shows cyclic voltammograms (CVs) of the flexible devices operated in different potential windows before an activation process (black curve is from −0.8 to 0.8 V, red curve is from −1 to 1 V, green curve is from −1.2 to 1.2 V, and blue curve is from −1.4 to 1.4 V).
Figure 7:
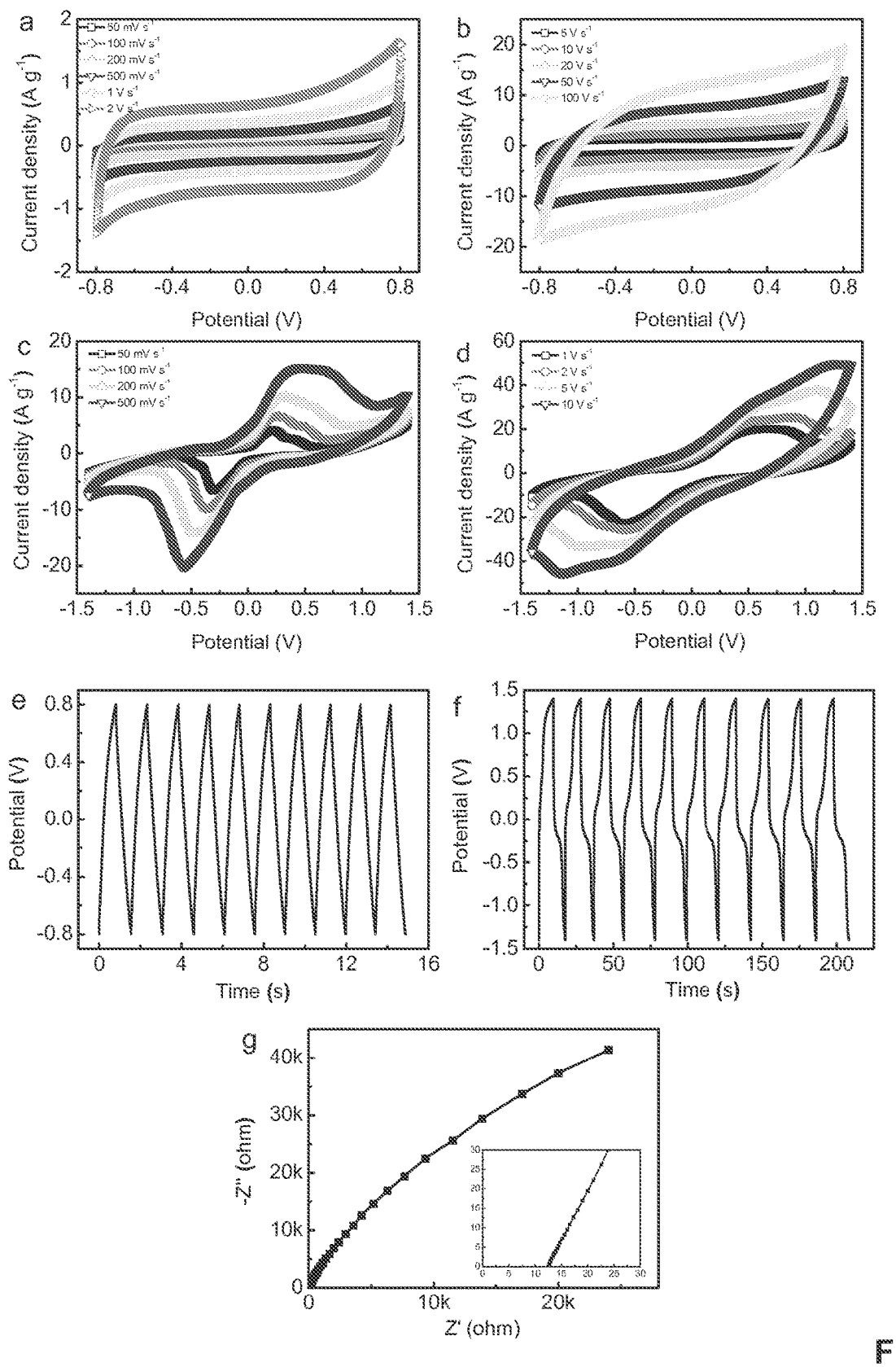
FIG. 7 shows data relating to electrochemical capacitor (EC) testing on the devices by using a solid electrolyte composed of KOH in polyvinyl alcohol (PVA, molecular weight of ~100 k) with a weight ratio of 2:3.
Figure 8:
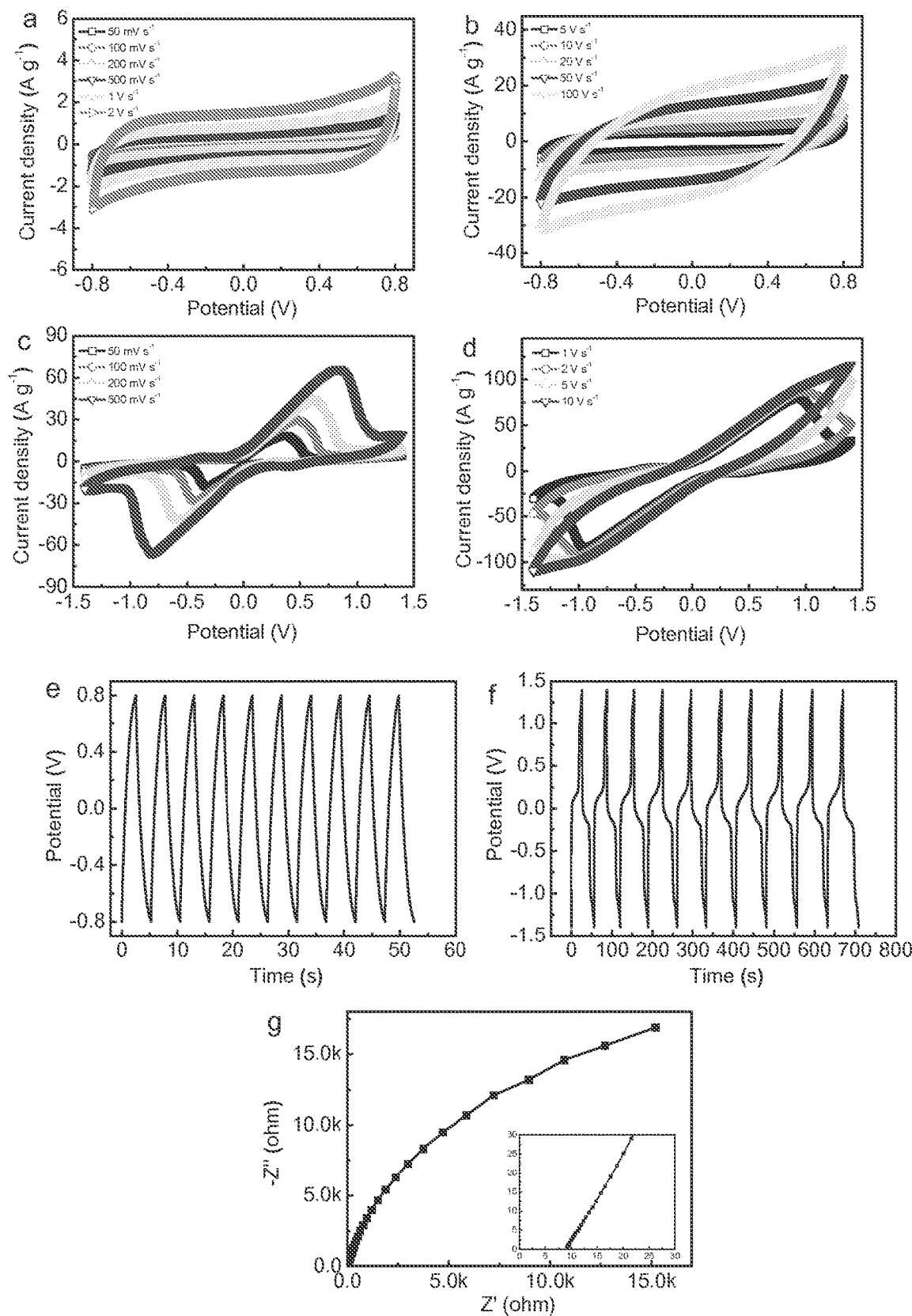
FIG. 8 shows EC testing on the devices by using a solid electrolyte composed of KOH in PVA (molecular weight of ~100 k) with a weight ratio of about 1:1.
Figure 9:
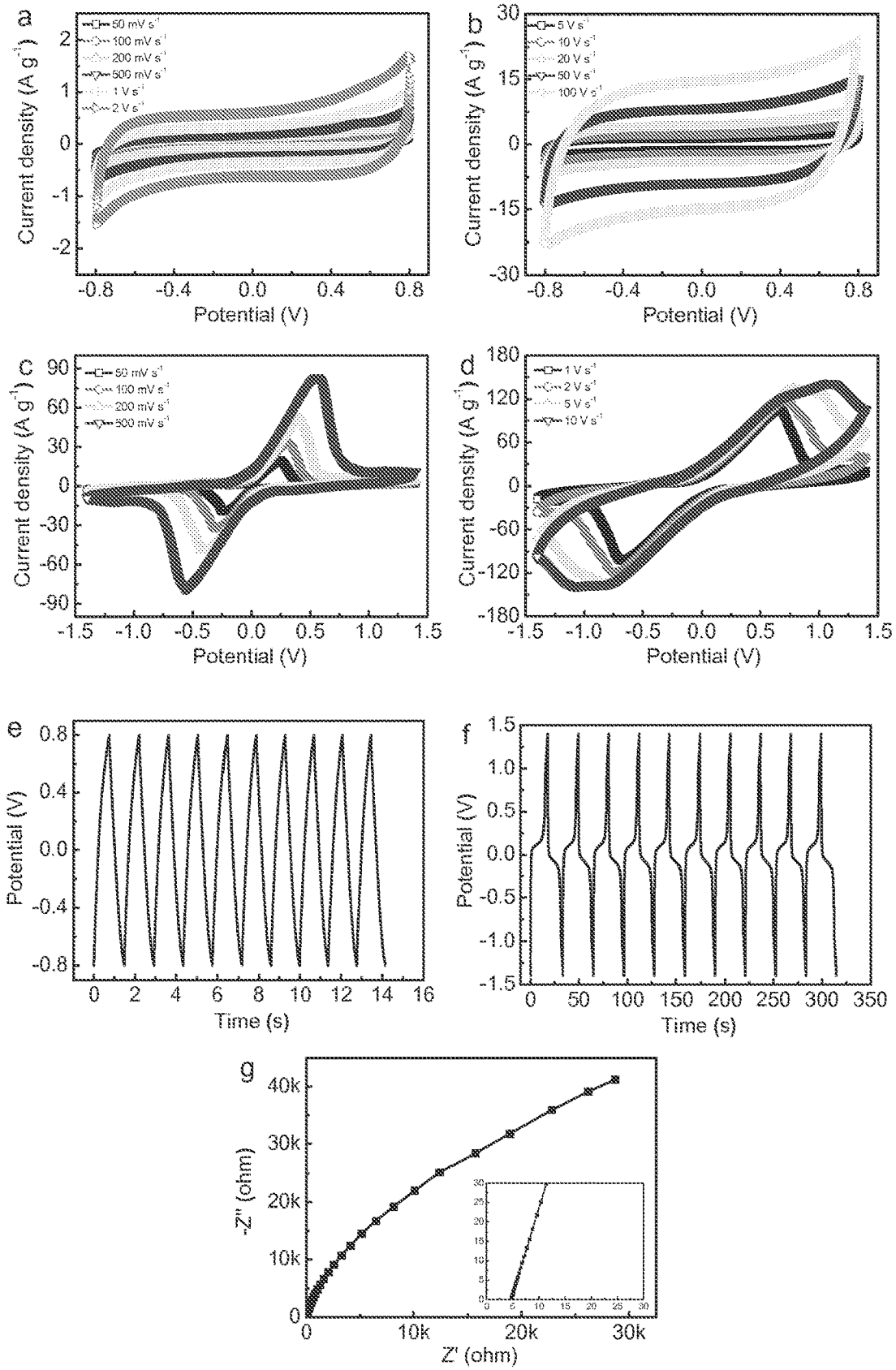
FIG. 9 shows EC testing on the devices by using a solid electrolyte composed of KOH in PVA (molecular weight of ~50 k) with a weight ratio of about 2:3.
Figure 10:
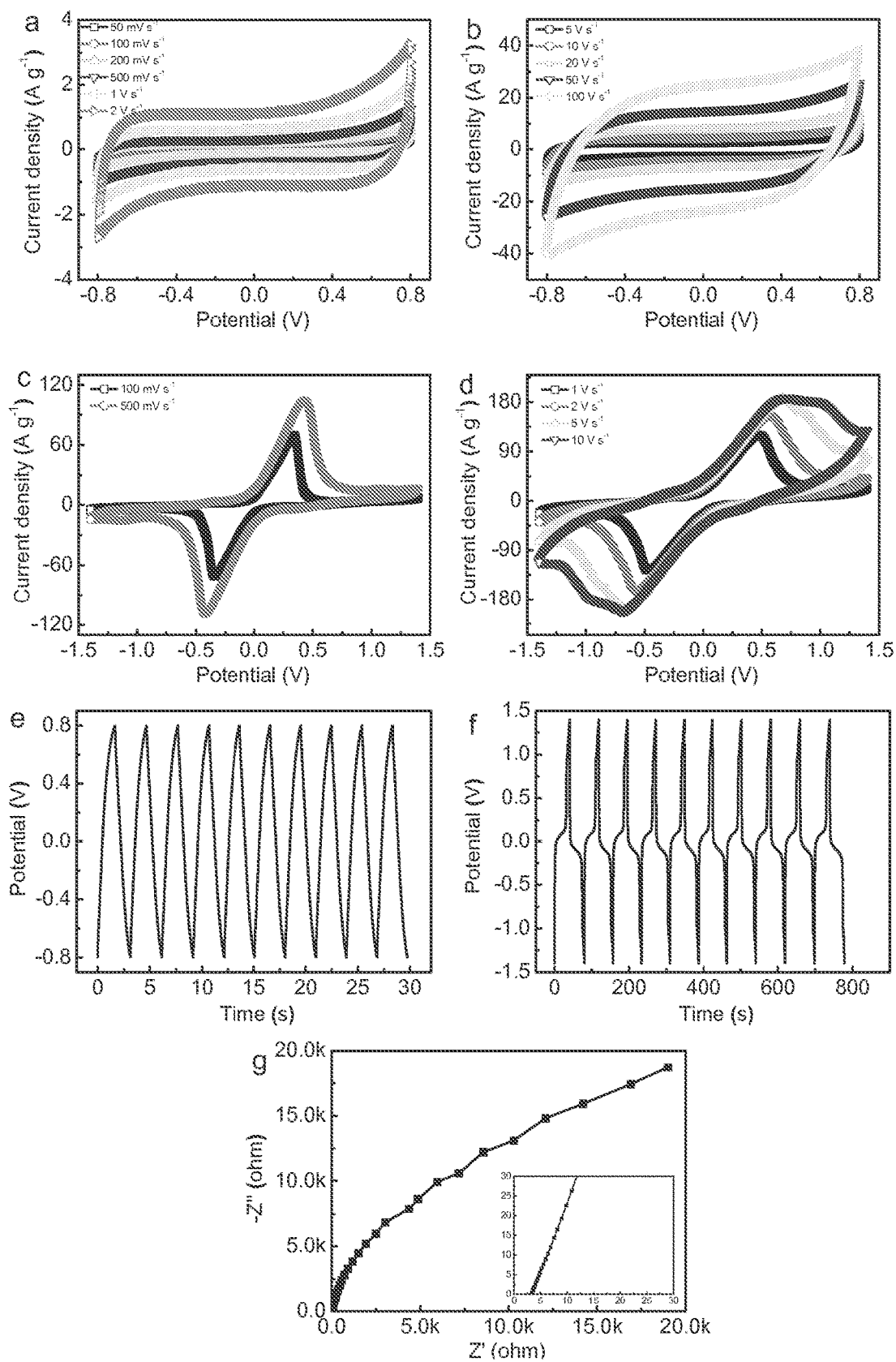
FIG. 10 shows EC testing on the devices by using a solid electrolyte composed of KOH in PVA (molecular weight of ~50 k) with a weight ratio of about 4:3.
Figure 11:
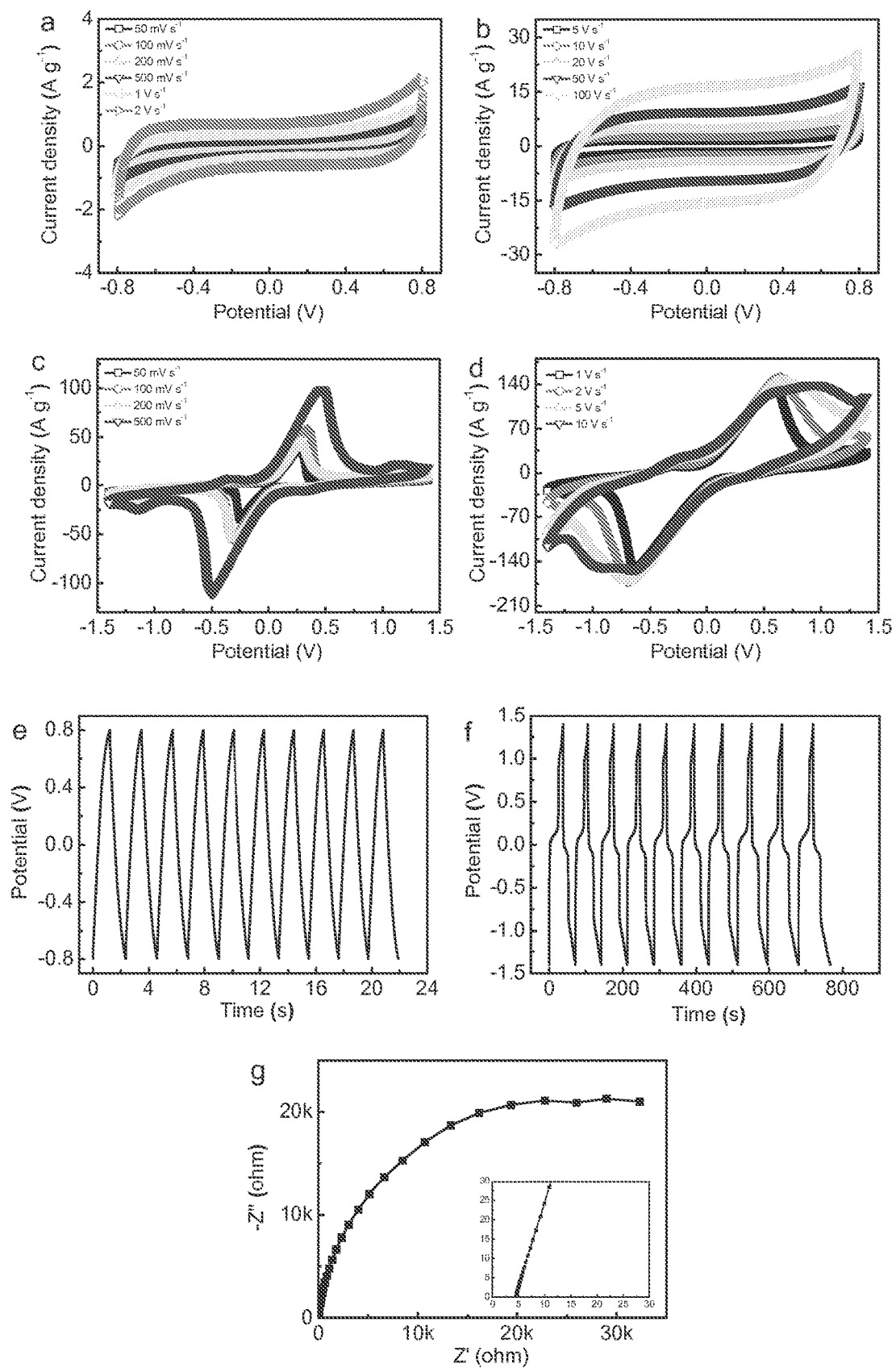
FIG. 11 shows EC testing on the devices by using a solid electrolyte composed of KOH in PVA (molecular weight of about 50 k) with a weight ratio ~5:3.

To confirm the conversion from $NiF_2$ to $Ni(OH)_2$ and optimize the operating potential window for ECs testing, different potential windows were used (i.e. PW-1: −0.8 to 0.8 V, PW-2: −1 to 1 V, PW-3: −1.2 to 1.2 V and PW-4: −1.4 to 1.4 V) (FIG. 6). First, when tested in PW-1 and PW-2 at different scan rates (50 mV s-1, 1, 10 and 100 V $s^{-1}$), no apparent redox peaks appear and only electric double layer capacitance can be found. When the potential window was extended to PW-3 (FIG. 6A), an incomplete anodic peak at ~1 V (oxidization reaction) emerged, which was due to the conversion reaction from $NiF_2$ to $Ni(OH)_2$. To make the complete conversion occur, the potential window was further extended to PW-4 and an anodic peak at ~1.1 V, ascribed to the irreversible conversion reaction (from $NiF_2$ to $Ni(OH)_2$), appeared together with a cathodic peak at ~0.3 V (reduction reaction) due to the formed $Ni(OH)_2$ ($Ni(OH)_2 + OH^- \leftrightarrows NiOOH + H_2O + e^-$). The gradually weakening of the conversion reaction with increased scan rates (FIGS. 6B-D) indicates a diffusion-controlled electrode process (faradaic reaction). Furthermore, it is promising that within different potential windows, no water decomposition was detected in the voltammograms.

EXAMPLE 1.7

Optimization in Composition of the Solid Electrode

The influence of the compositions of solid electrolytes based on polyvinyl alcohol (PVA)/KOH system, such as the molecular weight of PVA and weight ratio between PVA and KOH, were investigated to optimize the EC performance of the flexible devices (Table 1 and FIGS. 7-11). Two PVAs with different molecular weights of 50 k and 100 k were used. It is clear that lower molecular weight shows improved EC performances, and the weight ratio between PVA and KOH has an optimum performance at 1:1 in both 50 k-PVA and 100 k-PVA systems.

EXAMPLE 1.8

Activation Process

The NPL based symmetric EC devices show only EDLC behavior tested within potential window from −0.8 to 0.8 V, without an activation process, to in situ convert $NiF_2$ to $Ni(OH)_2$. An activation process was performed by CV (FIG. 14) within a potential window from −1.4 to 1.4 V at scan rate of 1 V s⁻. Because the conversion from $NiF_2$ to $Ni(OH)_2$ is an irreversible reaction, the more $Ni(OH)_2$ formed, the higher redox reaction peaks in CVs emerged, while there was a shifting away from their initial positions. After 400 cycles, the redox current peaks in CVs gradually become stable, and no further increase in peak intensity is observed. That implies that the $NiF_2$ was fully converted to $Ni(OH)_2$, and the EC devices started to behave as pseudocapacitors.

EXAMPLE 1.9

Mathematical Formulas for Estimating the EC Performances of the Devices

Considering the actual thickness of the NPL (~900 nm) is few orders of magnitude thinner than the thickness of the solid electrolyte and PET substrate used during EL testing, and to assess how much energy can be stored within the 900 nm-thick NPL in symmetric two-electrode flexible supercapacitors, the specific capacitance, energy density and power density were calculated based on the area and volume of the NPL in this Example. For practical applications in energy storage of a supercapacitor, an outstanding specific capacitance was expected by using NPL electrodes after technically reducing the thickness of the solid electrolyte or using thicker NPL.

Areal ($C_A$) and volumetric ($C_V$) capacitance of the NPL layer calculated from CVs are done according to eq 1 and 2:

$$C_A = \frac{1}{Sv(\Delta V)} \int I(V)dV \quad (1)$$

$$C_V = \frac{1}{V_0 v(\Delta V)} \int I(V)dV \quad (2)$$

In the above equations, S is the geometrical area of each NPL layer in the symmetric cells (3.8 cm²), $V_0$ is the geometrical volume of each NPL layer (3.42×10⁻⁴⁰ cm³), v is the scan rate, $\Delta V$ is the working potential window, and 1(V) is the response current.

The $C_A$ and $C_V$ of the NPL layer calculated from discharge curves are based on eq 3 and 4:

$$C_A = \frac{2I\Delta t}{S\Delta V} \quad (3)$$

$$C_V = \frac{2I\Delta t}{V_0\Delta V} \quad (4)$$

In the above equations, I is the discharge current, $\Delta t$ is the discharge duration, S is geometrical area of each NPL layer, $V_0$ is the geometrical volume of each NPL layer, and $\Delta V$ is the discharge potential window with deduction of IR drop.

The energy density (E) of the NPL layer was calculated according to eq 5:

$$E = \frac{1}{2}C(\Delta V)^2 \quad (5)$$

In the above equation, C is the capacitance calculated by the mass of the electrodes from discharge curves, and $\Delta V$ is the working potential window.

The power density (P) of the P of the NPL layer was calculated according to eq 6:

$$P = \frac{E}{\Delta t} \quad (6)$$

In the above equation, E is the energy density, and $\Delta t$ is discharge time.

The b-value (i.e., the relationship between peak currents and scan rates) were derived from eq 7:

$$i = av^b \quad (7)$$

In the above equation, i is peak current, v is scan rate, and a and b are adjustable parameters. The variation of the b-values indicates the characteristics of peak current, i.e. faradaic (b=0.5) and non-faradaic (b=1).

Without further elaboration, it is believed that one skilled in the art can, using the description herein, utilize the present disclosure to its fullest extent. The embodiments described herein are to be construed as illustrative and not as constraining the remainder of the disclosure in any way whatsoever. While the embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A method of making a conductive film for use as a component of an electronic device, said method comprising:
    associating an inorganic composition with an insulating substrate,
        wherein the insulating substrate comprises an insulating polymer,
        wherein the insulating substrate is associated with one or more adhesion layers and one or more conductive layers, and
        wherein the one or more adhesion layers are below the one or more conductive layers; and
    forming an inorganic layer from the inorganic composition on the insulating substrate,
        wherein the formed inorganic layer is porous, and
        wherein the formed inorganic layer comprises pores with diameters that range from about 2 nm to about 20 nm.

2. The method of claim 1, wherein the insulating polymer comprises poly(ethylene terephthalate).

3. The method of claim 1, wherein the one or more adhesion layers are selected from the group consisting of chromium, titanium, nickel, and combinations thereof.

4. The method of claim 1, further comprising a step of associating the insulating substrate with the one or more adhesion layers prior to associating the inorganic composition with the insulating substrate.

5. The method of claim 1, further comprising a step of associating the insulating substrate with the one or more conductive layers prior to associating the inorganic composition with the insulating substrate.

6. The method of claim 1, further comprising a step of cleaning the insulating substrate prior to associating the inorganic composition with the insulating substrate.

7. The method of claim 1, wherein the associating occurs by a method selected from the group consisting of sputtering, spraying, electrodeposition, printing, electron beam evaporation, thermal evaporation, atomic layer deposition, and combinations thereof.

8. The method of claim 1, wherein the associating occurs by electrochemical deposition.

9. The method of claim 1, wherein the inorganic composition is selected from the group consisting of metals, transition metals, metal oxides, transition metal oxides, metal chalcogenides, metal halides, alloys thereof, and combinations thereof.

10. The method of claim 1, wherein inorganic layer comprises pores with diameters ranging from about 2 nm to about 10 nm.

11. The method of claim 1, wherein the inorganic layer has a thickness ranging from about 1 nm to about 1 m.

12. The method of claim 1, wherein the inorganic layer has a thickness ranging from about 500 nm to about 1 μm.

13. The method of claim 1, wherein the formed conductive film has a thickness ranging from about 1 μm to about 1 m.

14. The method of claim 1, further comprising a step of incorporating the conductive film into an electronic device.

15. The method of claim 14, wherein the electronic device is selected from the group consisting of energy storage devices, electrodes, electrode systems, batteries, lithium-ion batteries, supercapacitors, electrochemical capacitors, microsupercapacitors, pseudocapacitors, electric double-layer capacitors, fuel cells, micro-circuits, semi-conductors, transistors, portable electronic devices, flexible electronic devices, and combinations thereof.

16. The method of claim 1, further comprising a step of associating the conductive film with a solid electrolyte.

17. The method of claim 16, wherein the solid electrolyte is positioned above the inorganic layer.

18. The method of claim 17, further comprising a step of associating the solid electrolyte with a second conductive film, wherein the second conductive film is positioned above the solid electrolyte, and wherein the inorganic layer of the second conductive film is directly associated with the solid electrolyte.

19. The method of claim 16, further comprising a step of incorporating the conductive film into an electronic device.

20. A method of making a conductive film for use as a component of an electronic device, said method comprising:
 associating an inorganic composition with an insulating substrate,
  wherein the insulating substrate is associated with one or more adhesion layers and one or more conductive layers, and
  wherein the one or more adhesion layers are below the one or more conductive layers; and
 forming an inorganic layer from the inorganic composition on the insulating substrate,
  wherein the forming of the inorganic layer comprises at least one of an anodic or cathodic treatment of the inorganic composition
  wherein the formed inorganic layer is porous, and
  wherein the formed inorganic layer comprises pores with diameters that range from about 2 nm to about 20 nm.

21. The method of claim 20, wherein the forming of the inorganic layer comprises a cathodic treatment of the inorganic composition.

22. A method of making a conductive film for use as a component of an electronic device, said method comprising:
 associating an inorganic composition with an insulating substrate; and
 forming an inorganic layer from the inorganic composition on the insulating substrate,
 wherein the formed inorganic layer is porous,
 wherein the formed inorganic layer comprises pores with diameters that range from about 2 nm to about 20 nm, and
 wherein the inorganic layer comprises the following formula:
  $MX_n$,
   wherein M is a metal selected from the group consisting of iron, nickel, cobalt, platinum, gold, aluminum, chromium, copper, manganese, magnesium, molybdenum, rhodium, silicon, tantalum, titanium, tungsten, uranium, vanadium, zirconium, alloys thereof, and combinations thereof;
   wherein X is a halide selected from the group consisting of fluorine, chlorine, bromine, and combinations thereof; and
   wherein n is an integer ranging from 1 to 6.

23. A method of making a conductive film for use as a component of an electronic device, said method comprising:
 associating an inorganic composition with an insulating substrate; and
 forming an inorganic layer from the inorganic composition on the insulating substrate,
  wherein the formed inorganic layer is porous,
  wherein the formed inorganic layer comprises pores with diameters that range from about 2 nm to about 20 nm, and
  wherein the inorganic layer comprises nickel fluoride ($NiF_2$).

24. A method of making a conductive film for use as a component of an electronic device, said method comprising:
 associating an inorganic composition with an insulating substrate,
  wherein the insulating substrate is associated with one or more adhesion layers and one or more conductive layers, and
  wherein the one or more adhesion layers are below the one or more conductive layers; and
 forming an inorganic layer from the inorganic composition on the insulating substrate,
  wherein the formed inorganic layer is porous, and
  wherein the formed inorganic layer comprises pores with diameters that range from about 2 nm to about 20 nm, and
 wherein the formed conductive film has a thickness ranging from about 100 μm to about 200 μm.

25. A conductive film for use as a component of an electronic device, wherein the conductive film comprises:
 an insulating substrate, wherein the insulating substrate is associated with one or more adhesion layers and one or more conductive layers, wherein the insulating substrate comprises an insulating polymer, and wherein the one or more adhesion layers are below the one or more conductive layers; and an inorganic layer associated with the insulating substrate,
wherein the inorganic layer is porous, and
wherein the formed inorganic layer comprises pores with diameters that range from about 2 nm to about 20 nm.

26. The conductive film of claim 25, wherein the insulating polymer comprises poly(ethylene terephthalate).

27. The conductive film of claim 25, wherein the one or more adhesion layers are selected from the group consisting of chromium, titanium, nickel, and combinations thereof.

28. The conductive film of claim 25, wherein the inorganic layer comprises pores with diameters ranging from about 2 nm to about 10 nm.

29. The conductive film of claim 25, wherein the inorganic layer has a thickness ranging from about 1 nm to about 1 m.

30. The conductive film of claim 25, wherein the inorganic layer has a thickness ranging from about 500 nm to about 1 µm.

31. The conductive film of claim 25, wherein the conductive film has a thickness ranging from about 1 µm to about 1 m.

32. The conductive film of claim 25, wherein the conductive film is incorporated into an electronic device.

33. The conductive film of claim 32, wherein the electronic device is selected from the group consisting of energy storage devices, electrodes, electrode systems, batteries, lithium-ion batteries, supercapacitors, electrochemical capacitors, microsupercapacitors, pseudocapacitors, electric double-layer capacitors, fuel cells, micro-circuits, semiconductors, transistors, portable electronic devices, flexible electronic devices, and combinations thereof.

34. The conductive film of claim 25, wherein the conductive film is associated with a solid electrolyte.

35. The conductive film of claim 34, wherein the solid electrolyte is positioned above the inorganic layer.

36. The conductive film of claim 35, wherein the solid electrolyte is associated with a second conductive film, wherein the second conductive film is positioned above the solid electrolyte, and wherein the inorganic layer of the second conductive film is directly associated with the solid electrolyte.

37. A conductive film for use as a component of an electronic device, wherein the conductive film comprises:
an insulating substrate; and
an inorganic layer associated with the insulating substrate, wherein the inorganic layer is porous,
wherein the inorganic layer comprises pores with diameters that range from about 2 nm to about 20 nm, and
wherein the inorganic layer comprises the following formula:
$MX_n$,
wherein M is a metal selected from the group consisting of iron, nickel, cobalt, platinum, gold, aluminum, chromium, copper, manganese, magnesium, molybdenum, rhodium, silicon, tantalum, titanium, tungsten, uranium, vanadium, zirconium, alloys thereof, and combinations thereof;
wherein X is a halide selected from the group consisting of fluorine, chlorine, bromine, and combinations thereof; and
wherein n is an integer ranging from 1 to 6.

38. A conductive film for use as a component of an electronic device, wherein the conductive film comprises:
an insulating substrate; and
an inorganic layer associated with the insulating substrate, wherein the inorganic layer is porous,
wherein the inorganic layer comprises pores with diameters that range from about 2 nm to about 20 nm, and
wherein the inorganic layer comprises nickel fluoride ($NiF_2$).

39. A conductive film for use as a component of an electronic device, wherein the conductive film comprises:
an insulating substrate, wherein the insulating substrate is associated with one or more adhesion layers and one or more conductive layers, wherein the one or more adhesion layers are below the one or more conductive layers; and
an inorganic layer associated with the insulating substrate, wherein the inorganic layer is porous, and wherein the formed inorganic layer comprises pores with diameters that range from about 2 nm to about 20 nm, and wherein the conductive film has a thickness ranging from about 100 µm to about 200 µm.

* * * * *